US012777803B2

(12) United States Patent
Han et al.

(10) Patent No.: US 12,777,803 B2
(45) Date of Patent: Oct. 27, 2026

(54) DISPLAY SUBSTRATE AND DISPLAY DEVICE

(71) Applicant: BOE Technology Group Co., Ltd., Beijing (CN)

(72) Inventors: Ying Han, Beijing (CN); Pan Xu, Beijing (CN); Guoying Wang, Beijing (CN); Xing Zhang, Beijing (CN); Chengyuan Luo, Beijing (CN); Mingi Chu, Beijing (CN); Dacheng Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 733 days.

(21) Appl. No.: 18/041,698

(22) PCT Filed: Jun. 29, 2022

(86) PCT No.: PCT/CN2022/102202

§ 371 (c)(1),
(2) Date: Feb. 15, 2023

(87) PCT Pub. No.: WO2024/000225

PCT Pub. Date: Jan. 4, 2024

(65) Prior Publication Data

US 2024/0008333 A1 Jan. 4, 2024

(51) Int. Cl.
*H10K 59/131* (2023.01)
*H10K 59/121* (2023.01)
(Continued)

(52) U.S. Cl.
CPC ..... *H10K 59/1315* (2023.02); *H10K 59/1213* (2023.02); *H10K 59/122* (2023.02);
(Continued)

(58) Field of Classification Search
CPC combination set(s) only.
See application file for complete search history.

(56) References Cited

U.S. PATENT DOCUMENTS 8,941,573 B2 1/2015 Lo
9,252,193 B2 2/2016 Kim et al.
(Continued)

FOREIGN PATENT DOCUMENTS

CN 1604698 A 4/2005
CN 101216644 A 7/2008
(Continued)

OTHER PUBLICATIONS

U.S. Appl. No. 18/259,460, filed Jun. 27, 2023, entitled "Display Substrate and Display Device", 91 pages.
(Continued)

*Primary Examiner* — Steven B Gauthier
*Assistant Examiner* — E. Rhett Cheek
(74) *Attorney, Agent, or Firm* — Westman, Champlin & Koehler, P.A.

(57) ABSTRACT

A display substrate and a display device are provided. The display substrate includes: a base substrate; a plurality of pixel units arranged on the base substrate, the plurality of pixel units are arranged in an array in a first direction and a second direction, each pixel unit includes a plurality of sub-pixels, each sub-pixel includes a light emitting element and a pixel driving circuit used to drive the light emitting element, and the pixel driving circuit includes a first transistor; and a plurality of gate lines arranged on the base substrate, the plurality of gate lines include a plurality of first gate lines used to provide a scanning signal to gate electrodes of the first transistors of the pixel driving circuits in a plurality of rows of sub-pixels respectively. At least one
(Continued)

first gate line includes a first gate sub-line, a second gate sub-line and a plurality of connecting lines.

20 Claims, 12 Drawing Sheets

(51) Int. Cl.
*H10K 59/122* (2023.01)
*H10K 59/35* (2023.01)
*H10K 59/80* (2023.01)

(52) U.S. Cl.
CPC ......... *H10K 59/351* (2023.02); *H10K 59/352* (2023.02); *H10K 59/8792* (2023.02)

(56) References Cited

U.S. PATENT DOCUMENTS

| | | | | |
|---|---|---|---|---|
| 9,589,493 | B2 | 3/2017 | Gai et al. | |
| 9,753,344 | B2 | 9/2017 | Lo | |
| 9,940,870 | B2 | 4/2018 | Yano et al. | |
| 10,102,788 | B2 | 10/2018 | Yoon et al. | |
| 10,236,335 | B2 | 3/2019 | Oh et al. | |
| 10,373,551 | B2 | 8/2019 | Yano et al. | |
| 10,418,422 | B2 | 9/2019 | Gu et al. | |
| 11,056,050 | B2 | 7/2021 | Yano et al. | |
| 11,624,961 | B2 | 4/2023 | He | |
| 12,396,337 | B2 * | 8/2025 | Choi | H10D 86/423 |
| 2013/0335457 | A1 | 12/2013 | Yano et al. | |
| 2014/0001447 | A1 | 1/2014 | Kim et al. | |
| 2014/0028536 | A1 | 1/2014 | Lo | |
| 2014/0313112 | A1 * | 10/2014 | Madhusudan | G09G 3/3208 345/83 |
| 2015/0098040 | A1 | 4/2015 | Lo | |
| 2015/0241748 | A1 | 8/2015 | Lee et al. | |
| 2016/0012761 | A1 | 1/2016 | Gai et al. | |
| 2016/0189591 | A1 | 6/2016 | Yoon et al. | |
| 2017/0236882 | A1 | 8/2017 | Matsunaga et al. | |
| 2018/0151661 | A1 * | 5/2018 | Oh | H10D 86/40 |
| 2018/0182825 | A1 | 6/2018 | Gu et al. | |
| 2018/0197459 | A1 | 7/2018 | Yano et al. | |
| 2019/0035874 | A1 * | 1/2019 | Han | H10K 59/1213 |
| 2019/0181207 | A1 * | 6/2019 | Kim | H10D 99/00 |
| 2019/0325817 | A1 | 10/2019 | Yano et al. | |
| 2019/0355802 | A1 * | 11/2019 | Shim | H10K 59/131 |
| 2020/0111858 | A1 * | 4/2020 | Lee | H10K 59/121 |
| 2020/0310206 | A1 | 10/2020 | He | |
| 2021/0167162 | A1 * | 6/2021 | Wu | H10D 86/481 |
| 2021/0280657 | A1 | 9/2021 | Huang | |
| 2022/0085133 | A1 | 3/2022 | Yuan et al. | |
| 2022/0165837 | A1 * | 5/2022 | Park | H10K 59/131 |
| 2022/0285474 | A1 * | 9/2022 | Kim | H10K 59/1315 |
| 2023/0006023 | A1 | 1/2023 | Yuan et al. | |
| 2023/0142473 | A1 | 5/2023 | Zhu et al. | |
| 2023/0165053 | A1 * | 5/2023 | Park | H10K 59/131 257/141 |

FOREIGN PATENT DOCUMENTS

| | | | | | |
|---|---|---|---|---|---|
| CN | 101241280 | A | | 8/2008 | |
| CN | 202512325 | U | | 10/2012 | |
| CN | 102809857 | A | | 12/2012 | |
| CN | 103515540 | A | | 1/2014 | |
| CN | 103779388 | A | | 5/2014 | |
| CN | 106205448 | A | | 12/2016 | |
| CN | 106206663 | A | | 12/2016 | |
| CN | 107589604 | A | | 1/2018 | |
| CN | 107656386 | A | | 2/2018 | |
| CN | 108122952 | A | | 6/2018 | |
| CN | 108322683 | A | | 7/2018 | |
| CN | 109143708 | A | | 1/2019 | |
| CN | 110047904 | A | | 7/2019 | |
| CN | 110376812 | A | | 10/2019 | |
| CN | 111524945 | A | | 8/2020 | |
| CN | 111613654 | A | | 9/2020 | |
| CN | 112331714 | A | * | 2/2021 | H10K 59/122 |
| CN | 112750860 | A | | 5/2021 | |
| CN | 113053985 | A | | 6/2021 | |
| CN | 113129799 | A | | 7/2021 | |
| CN | 113196493 | A | | 7/2021 | |
| CN | 113257883 | A | | 8/2021 | |
| CN | 113950744 | A | | 1/2022 | |
| CN | 113966551 | A | | 1/2022 | |
| CN | 114008785 | A | | 2/2022 | |
| CN | 114335029 | A | | 4/2022 | |
| CN | 114387905 | A | | 4/2022 | |
| CN | 115020452 | A | | 9/2022 | |
| JP | 5275825 | B2 | | 8/2013 | |
| JP | 2017058671 | A | | 3/2017 | |
| KR | 20190048356 | A | | 5/2019 | |

OTHER PUBLICATIONS

Chinese Office Action issued Apr. 15, 2026 from CNIPA for Chinese Patent Application No. 202280001985.2, 29 pages.

Office Action regarding corresponding Chinese application No. 202280003043.8, dated Jul. 25, 2026, 23 pages.

* cited by examiner

DISPLAY SUBSTRATE AND DISPLAY DEVICE

CROSS-REFERENCE TO RELATED APPLICATION

This application is a Section 371 National Stage Application of International Application No. PCT/CN2022/102202, filed on Jun. 29, 2022, entitled "DISPLAY SUBSTRATE AND DISPLAY DEVICE", the entire content of which is hereby incorporated by reference in its entirety.

TECHNICAL FIELD

The present disclosure relates to a field of a display technology, and in particular, to a display substrate and a display device.

BACKGROUND

OLED (Organic Light-Emitting Diode) is a kind of current-type organic light emitting device, which emits light through a carrier injection and a carrier recombination. A luminous intensity of the OLED is proportional to an injected current. Under an action of an electric field, holes generated by an anode of the OLED and electrons generated by a cathode of the OLED may move to be injected into a hole transport layer and an electron transport layer respectively, and migrate to a light emitting layer. When the two meet in the light emitting layer, energy excitons may be generated, which excite luminescent molecules to finally produce visible light. An OLED display device is a type of display device that displays an information such as an image by using luminous OLEDs. The OLED display device has characteristics such as a low power consumption, a high brightness and a high response speed.

In a field of OLED display, with a rapid development of high resolution products, higher requirements are put forward for a product yield and a cost control.

The above information disclosed in this section is merely for the understanding of the background of technical concepts of the present disclosure. Therefore, the above information may contain information that does not constitute a related art.

SUMMARY

In order to solve at least one aspect of the above-mentioned problems, the embodiments of the present disclosure provide a display substrate and a display device.

In an aspect, a display substrate is provided. The display substrate includes: a base substrate; a plurality of pixel units arranged on the base substrate, wherein the plurality of pixel units are arranged in an array in a first direction and a second direction, each of the pixel units includes a plurality of sub-pixels, each of the sub-pixels includes a light emitting element and a pixel driving circuit configured to drive the light emitting element, and the pixel driving circuit includes a first transistor; and a plurality of gate lines arranged on the base substrate, wherein the plurality of gate lines include a plurality of first gate lines configured to provide a scanning signal to gate electrodes of the first transistors of the pixel driving circuits in a plurality of rows of sub-pixels respectively; wherein at least one of the first gate lines includes a first gate sub-line, a second gate sub-line and a plurality of connecting lines, the first gate sub-line and the second gate sub-line extend in the first direction, the plurality of connecting lines extend in the second direction, the first gate sub-line and the second gate sub-line are spaced apart in the second direction, the plurality of connecting lines are spaced apart in the first direction, and the connecting line is configured to connect the first gate sub-line and the second gate sub-line.

According to some embodiments of the present disclosure, a row of pixel units include a plurality of pixel unit groups, and each of the pixel unit groups includes a first pixel unit and a second pixel unit adjacent to each other in the first direction; and the plurality of connecting lines include a first connecting line and a second connecting line, the first connecting line is located in a region where the first pixel unit in a pixel unit group is located, and the second connecting line is located in a region where the second pixel unit in a same pixel unit group is located.

According to some embodiments of the present disclosure, each of the first pixel unit and the second pixel unit includes a first sub-pixel and a second sub-pixel; and the first connecting line is located in a region where the pixel driving circuit of the first sub-pixel of the first pixel unit is located, and the second connecting line is located in a region where the pixel driving circuit of the second sub-pixel of the second pixel unit is located.

According to some embodiments of the present disclosure, the display substrate further includes a data signal line arranged on the base substrate and a first voltage line arranged on the base substrate, the data signal line is configured to provide a data signal to the pixel driving circuit, the first voltage line is configured to provide a first voltage signal to the pixel driving circuit, and the data signal line and the first voltage line extend in the second direction; the first connecting line is spaced apart from the data signal line configured to provide the data signal to the pixel driving circuit of the first sub-pixel of the first pixel unit, and the first connecting line is spaced apart from the first voltage line configured to provide the first voltage signal to the pixel driving circuit of the first sub-pixel of the first pixel unit; and the first connecting line is located, in the first direction, between the data signal line configured to provide the data signal to the pixel driving circuit of the first sub-pixel of the first pixel unit and the first voltage line configured to provide the first voltage signal to the pixel driving circuit of the first sub-pixel of the first pixel unit.

According to some embodiments of the present disclosure, the second connecting line is spaced apart from the data signal line configured to provide the data signal to the pixel driving circuit of the second sub-pixel of the second pixel unit, and the second connecting line is spaced apart from the first voltage line configured to provide the first voltage signal to the pixel driving circuit of the second sub-pixel of the second pixel unit; and the second connecting line is located, in the first direction, between the data signal line configured to provide the data signal to the pixel driving circuit of the second sub-pixel of the second pixel unit and the first voltage line configured to provide the first voltage signal to the pixel driving circuit of the second sub-pixel of the second pixel unit.

According to some embodiments of the present disclosure, the pixel driving circuit further includes a second transistor; the plurality of gate lines include a plurality of second gate lines configured to provide a scanning signal to gate electrodes of the second transistors of the pixel driving circuits of a plurality of rows of sub-pixels respectively; and at least one of the second gate lines includes a gate line body portion and a gate line additional portion connected to the gate line body portion, and the at least one of the second gate lines includes a ring structure surrounded by the gate line body portion and the gate line additional portion.

According to some embodiments of the present disclosure, the gate line additional portion includes a first additional portion, a second additional portion and a third additional portion, the first additional portion and the second additional portion extend from the gate line body portion respectively in the second direction, the third additional portion extends in the first direction, one end of the first additional portion is connected to the gate line body portion, another end of the first additional portion is connected to one end of the third additional portion, another end of the third additional portion is connected to one end of the second additional portion, and another end of the second additional portion is connected to the gate line body portion.

According to some embodiments of the present disclosure, the display substrate includes: a first conductive film layer arranged on the base substrate; a semiconductor film layer arranged on a side of the first conductive film layer away from the base substrate; a second conductive film layer arranged on a side of the semiconductor film layer away from the base substrate; and a third conductive film layer arranged on a side of the second conductive film layer away from the base substrate, wherein the first gate sub-line, the second gate sub-line and the plurality of connecting lines are located in the second conductive film layer.

According to some embodiments of the present disclosure, the first transistor includes a first active layer located in the semiconductor film layer; an orthographic projection of the first gate sub-line on the base substrate overlaps partially with an orthographic projection of the first active layer on the base substrate; and an orthographic projection of the second gate sub-line on the base substrate is spaced apart from the orthographic projection of the first active layer on the base substrate.

According to some embodiments of the present disclosure, orthographic projections of the plurality of connecting lines on the base substrate are spaced apart from an orthographic projection of the semiconductor film layer on the base substrate.

According to some embodiments of the present disclosure, the pixel driving circuit includes the first transistor, a second transistor, and a third transistor; the pixel driving circuit includes a first active layer, a second active layer and a third active layer, and the first active layer, the second active layer and the third active layer are located in the semiconductor film layer; and a part of the first gate line overlapping with the first active layer forms the gate electrode of the first transistor, and a part of the second gate sub-line overlapping with the second active layer forms a gate electrode of the second transistor.

According to some embodiments of the present disclosure, the display substrate further includes: a first conductive portion, a second conductive portion and a first capacitor portion, wherein the first conductive portion, the second conductive portion and the first capacitor portion are located in the first conductive film layer; and a second capacitor portion located in the semiconductor film layer, wherein the second capacitor portion is connected to the first active layer, and each of an orthographic projection of the first active layer on the base substrate, an orthographic projection of the second active layer on the base substrate, an orthographic projection of the third active layer on the base substrate and an orthographic projection of the second capacitor portion on the base substrate overlaps at least partially with an orthographic projection of the first capacitor portion on the base substrate.

According to some embodiments of the present disclosure, the display substrate further includes a first voltage line, a data signal line, a sensing signal line and an auxiliary cathode line, and the first voltage line, the data signal line, the sensing signal line and the auxiliary cathode line are located in the third conductive film layer; and the first voltage line, the data signal line, the sensing signal line and the auxiliary cathode line extend in the second direction respectively, and any two of the first voltage line, the data signal line, the sensing signal line and the auxiliary cathode line are spaced apart in the first direction.

According to some embodiments of the present disclosure, each of the first pixel unit and the second pixel unit further includes a third sub-pixel and a fourth sub-pixel; and in each pixel unit in at least one pixel unit group, the pixel driving circuit of the first sub-pixel, the pixel driving circuit of the fourth sub-pixel, the pixel driving circuit of the third sub-pixel and the pixel driving circuit of the second sub-pixel are arranged in sequence in the first direction.

According to some embodiments of the present disclosure, in at least one pixel unit group, the third active layer of the pixel driving circuit of the first sub-pixel of the first pixel unit is electrically connected to the first voltage line through a first via hole; and an orthographic projection of the first via hole on the base substrate and an orthographic projection of the first connecting line on the base substrate are spaced apart from each other in the second direction and overlap at least partially with each other in the first direction.

According to some embodiments of the present disclosure, in at least one pixel unit group, each of the second sub-pixel, the third sub-pixel and the fourth sub-pixel of the first pixel unit includes a first conductive connecting portion located in the third conductive film layer; the first voltage line is electrically connected to the first conductive portion through a second via hole; each of one end of the first conductive connecting portion of the second sub-pixel of the first pixel unit, one end of the first conductive connecting portion of the third sub-pixel of the first pixel unit and one end of the first conductive connecting portion of the fourth sub-pixel of the first pixel unit is electrically connected to the first conductive portion through a third via hole; and each of another end of the first conductive connecting portion of the second sub-pixel of the first pixel unit, another end of the first conductive connecting portion of the third sub-pixel of the first pixel unit and another end of the first conductive connecting portion of the fourth sub-pixel of the first pixel unit is electrically connected to the respective third active layer through a fourth via hole.

According to some embodiments of the present disclosure, in at least one pixel unit group, the third active layer of the pixel driving circuit of the second sub-pixel of the second pixel unit is electrically connected to the first voltage line through a first via hole; and an orthographic projection of the first via hole for the second sub-pixel of the second pixel unit on the base substrate and an orthographic projection of the second connecting line on the base substrate are spaced apart from each other in the second direction and overlap at least partially with each other in the first direction.

According to some embodiments of the present disclosure, in at least one pixel unit group, each of the first sub-pixel, the third sub-pixel and the fourth sub-pixel of the second pixel unit includes a first conductive connecting portion located in the third conductive film layer; the first voltage line is electrically connected to the first conductive portion through a second via hole; each of one end of the first conductive connecting portion of the first sub-pixel of the second pixel unit, one end of the first conductive connecting portion of the third sub-pixel of the second pixel unit and one end of the first conductive connecting portion of the fourth sub-pixel of the second pixel unit is electrically connected to the first conductive portion through a third via hole; and each of another end of the first conductive connecting portion of the first sub-pixel of the second pixel unit, another end of the first conductive connecting portion of the third sub-pixel of the second pixel unit and another end of the first conductive connecting portion of the fourth sub-pixel of the second pixel unit is electrically connected to the respective third active layer through a fourth via hole.

According to some embodiments of the present disclosure, the first active layer of the pixel driving circuit of each sub-pixel is electrically connected to the respective data signal line through a fifth via hole; in the first pixel unit, each of an orthographic projection of the second via hole on the base substrate and an orthographic projection of the fifth via hole on the base substrate is spaced apart from the orthographic projection of the first connecting line on the base substrate, and the orthographic projection of the first connecting line on the base substrate is located, in the first direction, between the orthographic projection of the second via hole on the base substrate and the orthographic projection of the fifth via hole on the base substrate; and/or in the second pixel unit, each of the orthographic projection of the second via hole on the base substrate and the orthographic projection of the fifth via hole on the base substrate is spaced apart from the orthographic projection of the second connecting line on the base substrate, and the orthographic projection of the second connecting line on the base substrate is located, in the first direction, between the orthographic projection of the second via hole on the base substrate and the orthographic projection of the fifth via hole on the base substrate.

According to some embodiments of the present disclosure, in the first sub-pixel of the first pixel unit, the orthographic projection of the second via hole on the base substrate and the orthographic projection of the fifth via hole on the base substrate are spaced apart by a first separation distance in the first direction; in each of the second sub-pixel, the third sub-pixel and the fourth sub-pixel of the first pixel unit, an orthographic projection of the third via hole on the base substrate and the orthographic projection of the fifth via hole on the base substrate are spaced apart by a second separation distance in the first direction; the first separation distance is greater than the second separation distance; and/or in the second sub-pixel of the second pixel unit, the orthographic projection of the second via hole on the base substrate and the orthographic projection of the fifth via hole on the base substrate are spaced apart by a third separation distance in the first direction; in each of the first sub-pixel, the third sub-pixel and the fourth sub-pixel of the second pixel unit, the orthographic projection of the third via hole on the base substrate and the orthographic projection of the fifth via hole on the base substrate are spaced apart by a fourth separation distance in the first direction; the third separation distance is greater than the fourth separation distance.

According to some embodiments of the present disclosure, an orthographic projection of the first conductive portion on the base substrate and an orthographic projection of the first gate sub-line on the base substrate are spaced apart in the second direction; and the orthographic projection of the first conductive portion on the base substrate and an orthographic projection of the second gate sub-line on the base substrate are spaced apart in the second direction.

According to some embodiments of the present disclosure, the first conductive portion includes a first side surface away from the third via hole, an orthographic projection of the first side surface of the first conductive portion on the base substrate and the orthographic projection of the first gate sub-line on the base substrate are spaced apart by a first distance in the second direction, the orthographic projection of the first side surface of the first conductive portion on the base substrate and the orthographic projection of the second gate sub-line on the base substrate are spaced apart by a second distance in the second direction, and the second distance is less than the first distance.

According to some embodiments of the present disclosure, an orthographic projection of the second gate line on the base substrate overlaps partially with an orthographic projection of the first voltage line on the base substrate, an orthographic projection of the data signal line on the base substrate, an orthographic projection of the sensing signal line on the base substrate and an orthographic projection of the auxiliary cathode line on the base substrate respectively at a first position, a second position, a third position and a fourth position; and a second gate line includes at least one ring structure located in at least one of the first position, the second position, the third position and the fourth position.

According to some embodiments of the present disclosure, a second gate line includes a plurality of ring structures located at the first position and the fourth position respectively.

According to some embodiments of the present disclosure, the display substrate further includes a second conductive connecting portion and a third conductive connecting portion that are located in the third conductive film layer, and the second conductive connecting portion is connected to the sensing signal line; in a pixel unit, each of the second active region of the second transistor of the first sub-pixel and the second active region of the second transistor of the second sub-pixel is electrically connected to the sensing signal line through the third conductive connecting portion, the second conductive portion and the second conductive connecting portion, and each of the second active region of the second transistor of the third sub-pixel and the second active region of the second transistor of the fourth sub-pixel is electrically connected to the sensing signal line through the second conductive connecting portion; and each of an orthographic projection of the third conductive connecting portion on the base substrate, an orthographic projection of the second conductive portion on the base substrate and an orthographic projection of the second conductive connecting portion on the base substrate is spaced apart from an orthographic projection of the ring structure of the second gate line on the base substrate.

According to some embodiments of the present disclosure, the display substrate further includes a first electrode layer on a side of the third conductive film layer away from the base substrate, and the display substrate includes a plurality of anodes located in the first electrode layer; and for at least one pixel unit group, the pixel driving circuits of the plurality of sub-pixels are arranged side by side in the first direction, and the anodes of the light emitting elements of the plurality of sub-pixels are arranged in two rows in the second direction.

According to some embodiments of the present disclosure, for a sub-pixel, a relationship between an orthographic projection of the pixel driving circuit of the sub-pixel on the base substrate and an orthographic projection of the anode of the light emitting element of the sub-pixel on the base substrate includes: the orthographic projection of the pixel driving circuit of the sub-pixel on the base substrate exceeds the orthographic projection of the anode of the light emitting element of the sub-pixel on the base substrate in the second direction; and/or the orthographic projection of the anode of the light emitting element of the sub-pixel on the base substrate exceeds the orthographic projection of the pixel driving circuit of the sub-pixel on the base substrate in the first direction.

In another aspect, a display device is provided, and the display device includes the display substrate described above.

BRIEF DESCRIPTION OF THE DRAWINGS

With following descriptions of the present disclosure with reference to the accompanying drawings, other objectives and advantages of the present disclosure may be obvious and the present disclosure may be understood comprehensively.

Figure 1:
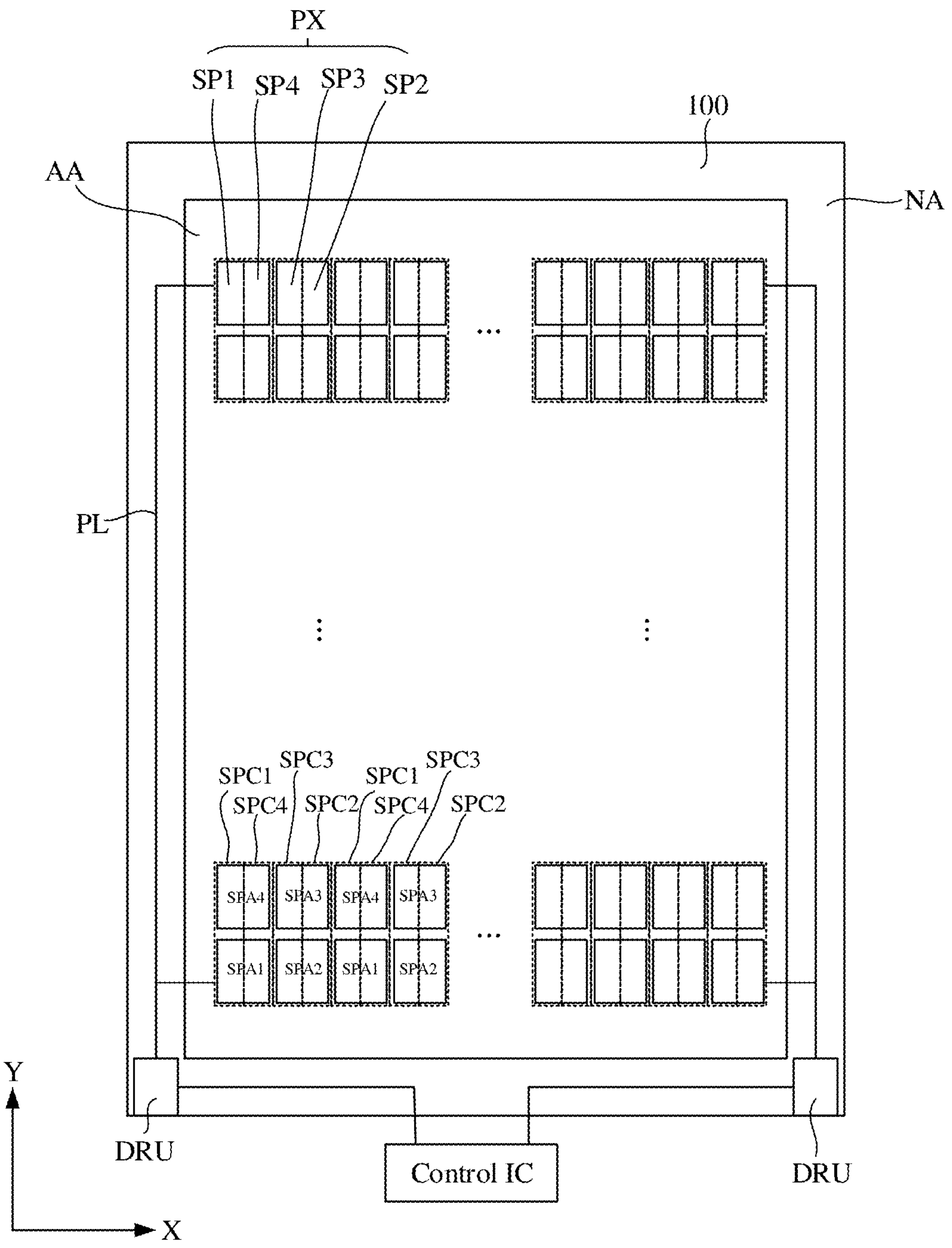
FIG. 1 shows a schematic plan view of a display substrate according to the embodiments of the present disclosure.

It should be noted that for the sake of clarity, in the accompanying drawings used to describe the embodiments of the present disclosure, sizes of layers, structures or regions may be enlarged or reduced, that is, these accompanying drawings are not drawn according to actual scale.

DETAILED DESCRIPTION OF EMBODIMENTS

Technical solutions of the present disclosure will be further described in detail below through the embodiments with reference to the accompanying drawings. In the specification, the same or similar reference numerals represent the same or similar components. The following descriptions of the embodiments of the present disclosure with reference to the accompanying drawings are intended to explain a general inventive concept of the present disclosure, and should not be understood as a limitation to the present disclosure.

In addition, in the following detailed descriptions, for the convenience of explanation, many specific details are set forth to provide comprehensive understanding of the embodiments of the present disclosure. Obviously, however, one or more embodiments may also be implemented without these specific details.

It should be understood that, although the terms "first," "second" and so on may be used here to describe different elements, these elements should not be limited by these terms. These terms are merely used to distinguish one element from another element. For example, without departing from the scope of the exemplary embodiments, a first element may be named as a second element, and similarly, the second element may be named as the first element. The term "and/or" as used here includes any and all combinations of one or more related listed items.

It should be understood that when an element or layer is referred to as being "formed on" another element or layer, the element or layer may be formed directly or indirectly on the other element or layer. That is, for example, an intermediate element or an intermediate layer may be provided. In contrast, when an element or layer is referred to as being "directly formed on" another element or layer, no intermediate element or intermediate layer is provided. Other terms used to describe a relationship between elements or layers (for example, "between" and "directly between", "adjacent to" and "directly adjacent to", etc.) should be interpreted in a similar manner.

Herein, the directional expressions "first direction" and "second direction" are used to describe different directions along a pixel region, e.g., a longitudinal direction and a transverse direction of the pixel region. It should be understood that such expressions are merely exemplary descriptions and not limitations to the present disclosure.

Herein, unless otherwise specified, the expression "located in the same layer" generally means that a first component and a second component may be made of the same material and may be formed by the same patterning process. The expression "A and B are connected as a whole" means that component A and component B are integrally formed, that is, they generally contain the same material and are formed as a structurally continuous integral component.

Transistors used in the embodiments of the present disclosure may be thin film transistors, or field effect transistors, or other devices with same characteristics. Since a source electrode and a drain electrode of a thin film transistor used here are symmetrical, the source electrode and the drain electrode may be interchanged. In the following examples, a P-type thin film transistor used as a driving transistor is mainly described, and the types of other transistors may be the same as or different from the driving transistor according to a circuit design. Similarly, in other embodiments, the driving transistor may also be shown as an N-type thin film transistor.

Some exemplary embodiments of the present disclosure provide a display substrate. The display substrate includes: a base substrate; a plurality of pixel units arranged on the base substrate, wherein the plurality of pixel units are arranged in an array in a first direction and a second direction, each of the pixel units includes a plurality of sub-pixels, each of the sub-pixels includes a light emitting element and a pixel driving circuit used to drive the light emitting element, and the pixel driving circuit includes a first transistor; and a plurality of gate lines arranged on the base substrate, wherein the plurality of gate lines include a plurality of first gate lines used to provide a scanning signal to gate electrodes of the first transistors of the pixel driving circuits in a plurality of rows of sub-pixels respectively. At least one of the first gate lines includes a first gate sub-line, a second gate sub-line and a plurality of connecting lines, the first gate sub-line and the second gate sub-line extend in the first direction, and the plurality of connecting lines extend in the second direction. The first gate sub-line and the second gate sub-line are spaced apart in the second direction, and the plurality of connecting lines are spaced apart in the first direction. The connecting line is used to connect the first gate sub-line and the second gate sub-line. In the embodiments of the present disclosure, in view of a possible bad process at a cross-wire position, a double-wire design is adopted for some signal lines. Accordingly, when a short circuit, an open circuit and other bad processes occur at the cross-wire position, for example, when a short circuit at the cross-wire position is found in a test stage of the display substrate, a position of the bad process such as short circuit, open circuit and so on may be cut off, and a normal signal line in the double-wire design may operate, so that a product yield may be improved.

Figure 2:
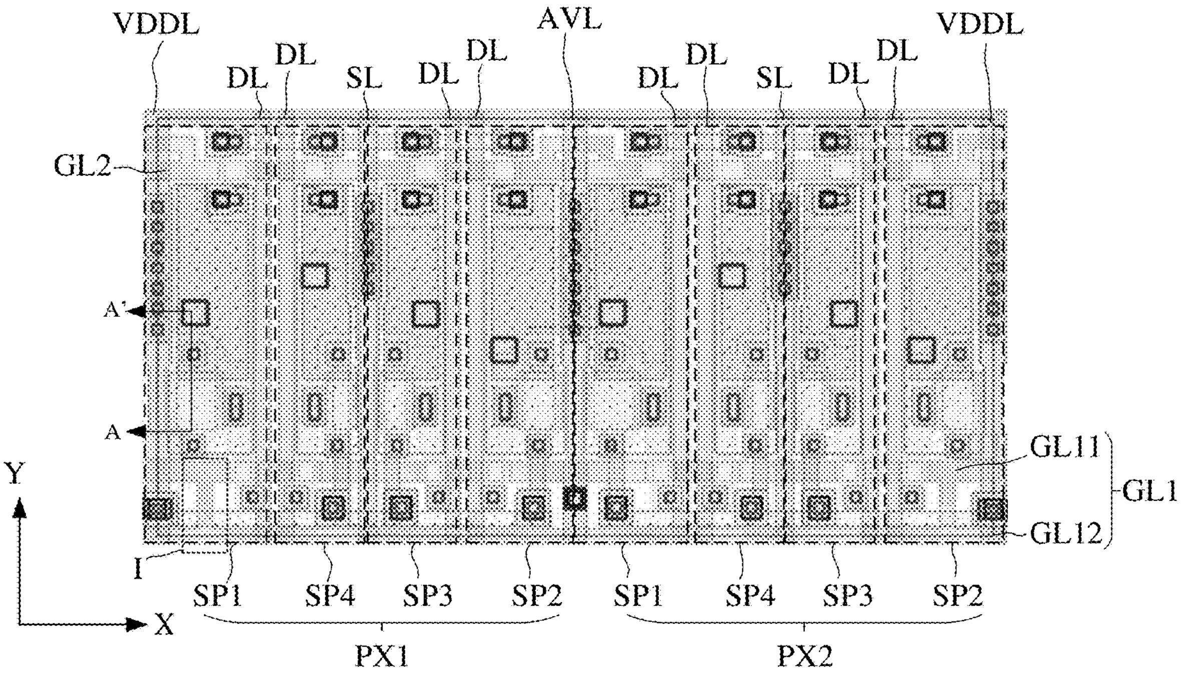
FIG. 2 shows a partial plan view of the display substrate according to the embodiments of the present disclosure, in which more specific structures of the display substrate are schematically shown.

FIG. 1 shows a schematic plan view of a display substrate according to the embodiments of the present disclosure. FIG. 2 shows a partial plan view of the display substrate according to the embodiments of the present disclosure, in which more specific structures of the display substrate are schematically shown. Referring to FIG. 1 and FIG. 2 in combination, the display substrate according to the embodiments of the present disclosure may include a base substrate 100, a pixel unit PX arranged on the base substrate 100, a driving unit DRU arranged on the base substrate 100, and a wire PL for electrically connecting the pixel unit PX and the driving unit DRU. The driving unit DRU is used to drive the pixel unit PX.

The display substrate may include a display region AA and a non-display region NA. The display region AA may be a region in which the pixel unit PX for displaying an image is arranged. Each pixel unit PX will be described later. The non-display region NA is a region in which no image is displayed. The driving unit DRU used to drive the pixel unit PX and some wires PL used to connect the pixel unit PX and the driving unit DRU may be arranged in the non-display region NA. The non-display region NA corresponds to a bezel in a final display device, and a width of the bezel may be determined according to a width of the non-display region NA.

The display region AA may have various shapes. For example, the display region AA may be provided in various shapes such as a closed polygon including straight sides (e.g., rectangle), a circle, an ellipse and so on that includes a curved side, and a semicircle, a semi-ellipse and so on that includes a straight side and a curved side. In the embodiments of the present disclosure, the display region AA is provided as a region having a quadrangular shape including straight sides. It should be understood that this is merely an exemplary embodiment of the present disclosure, rather than a limitation to the present disclosure.

The non-display region NA may be arranged on at least one side of the display region AA. In the embodiments of the present disclosure, the non-display region NA may surround a periphery of the display region AA. In the embodiments of the present disclosure, the non-display region NA may include a lateral part extending in a first direction X and a longitudinal part extending in a second direction Y.

The pixel unit PX is arranged in the display region AA. The pixel unit PX is a minimum unit for displaying an image, and a plurality of pixel units may be provided. For example, the pixel unit PX may include light emitting device(s) emitting white light and/or color light.

A plurality of pixel units PX may be provided, and the plurality of pixel units PX may be arranged in a matrix form along rows extending in the first direction X and columns extending in the second direction Y. However, the embodiments of the present disclosure do not specifically limit an arrangement form of the pixel units PX, and the pixel units PX may be arranged in various forms. For example, the pixel units PX may be arranged such that a direction inclined with respect to the first direction X and the first direction Y is a column direction, and a direction intersecting the column direction is a row direction.

In the embodiments of the present disclosure, a row of pixel units may include a plurality of pixel unit groups. Here, "a row of pixel units" may be understood as at least one row of pixel units or any row of pixel units. For example, the "pixel unit group" may be a repetitive unit of the arrangement of pixel units. Each pixel unit group includes at least two pixel units that are arranged adjacent to each other in the first direction X. For example, for the convenience of description, each pixel unit group herein may include a first pixel unit PX1 and a second pixel unit PX2 that are adjacent in the first direction.

A pixel unit PX may include a plurality of sub-pixels. For example, a pixel unit PX may include three sub-pixels, including a first sub-pixel SP1, a second sub-pixel SP2 and a third sub-pixel SP3. For another example, a pixel unit PX may include four sub-pixels, including the first sub-pixel SP1, the second sub-pixel SP2, the third sub-pixel SP3 and a fourth sub-pixel SP4. For example, the first sub-pixel SP1 may be a red sub-pixel, the second sub-pixel SP2 may be a green sub-pixel, the third sub-pixel SP3 may be a blue sub-pixel, and the fourth sub-pixel SP4 may be a white sub-pixel.

Each sub-pixel may include a light emitting element and a pixel driving circuit used to drive the light emitting element. For example, the first sub-pixel SP1 may include a first light emitting element located in a first light emitting region SPA1 and a first pixel driving circuit SPC1 used to drive the first light emitting element, and the first light emitting element may emit red light; the second sub-pixel SP2 may include a second light emitting element located in a second light emitting region SPA2 and a second pixel driving circuit SPC2 used to drive the second light emitting element, and the second light emitting element may emit green light; the third sub-pixel SP3 may include a third light emitting element located in a third light emitting region SPA3 and a third pixel driving circuit SPC3 used to drive the third light emitting element, and the third light emitting element may emit blue light; the fourth sub-pixel SP4 may include a fourth light emitting element located in a fourth light emitting region SPA4 and a fourth pixel driving circuit SPC4 used to drive the fourth light emitting element, and the fourth light emitting element may emit white light.

The light emitting region of the sub-pixel may be a region where the light emitting element of the sub-pixel is located. For example, in an OLED display panel, the light emitting element of the sub-pixel may include an anode, a luminescent material layer and a cathode arranged in a stack. Accordingly, the light emitting region of the sub-pixel may be a region corresponding to a part of the luminescent material layer sandwiched between the anode and the cathode.

It should be understood that the sub-pixel may further include a non-light emitting region. For example, the pixel driving circuit of the sub-pixel is located in the non-light emitting region of the sub-pixel. A ratio of an area of the light emitting region of each sub-pixel to an overall area (a sum of the area of the light emitting region and an area of the non-light emitting region) of the sub-pixel determines an opening rate of the sub-pixel.

Figure 4:
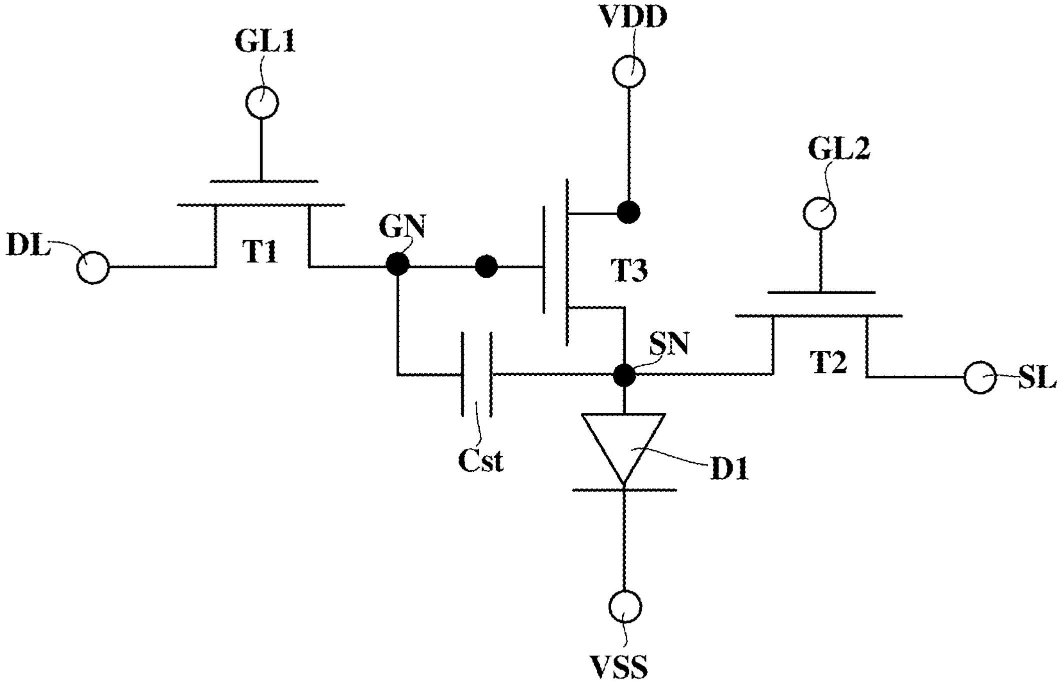
FIG. 4 shows an equivalent circuit diagram of a pixel driving circuit of the display substrate according to some exemplary embodiments of the present disclosure.

FIG. 4 shows an equivalent circuit diagram of a pixel driving circuit of the display substrate according to some exemplary embodiments of the present disclosure. Referring to FIG. 4, the pixel driving circuit may include a plurality of elements such as a first transistor T1, a second transistor T2, a third transistor T3 and a storage capacitor Cstl. For example, the first transistor T1 may also be referred to as a first switching transistor, the second transistor T2 may also be referred to as a second switching transistor, and the third transistor T3 may also be referred to as a driving transistor. The pixel driving circuit may be referred to as a 3T1C structure.

It should be noted that the 3T1C structure is illustrated here by way of example in describing the pixel driving circuit included in the display substrate according to the embodiments of the present disclosure, but the pixel driving circuit included in the display substrate in the embodiments of the present disclosure is not limited to the 3T1C structure.

Continuing to refer to FIG. 4, the first transistor T1 has a gate electrode electrically connected to a first gate line GL1, a first electrode electrically connected to a data signal line DL, and a second electrode electrically connected to a gate electrode of the third transistor T3. For example, the second electrode of the first transistor T1 and the gate electrode of the third transistor T3 may be electrically connected to a node GN. The first transistor T1 is used to control writing of a voltage signal from the data signal line DL to the pixel driving circuit.

It should be noted that each transistor may include an active layer, a gate electrode, a first electrode, and a second electrode. For example, the first transistor T1 includes a first gate electrode G1 and a first active layer ACT1; the second transistor T2 includes a second gate electrode G2 and a second active layer ACT2; the third transistor T3 includes a third gate electrode G3 and a third active layer ACT3.

It should also be noted that herein, the first electrode of the transistor may refer to one of a source electrode and a drain electrode of the transistor, and the second electrode of the transistor may refer to the other of the source electrode and the drain electrode of the transistor.

The gate electrode of the third transistor T3 is electrically connected to the node GN, the first electrode of the third transistor T3 is electrically connected to a first voltage line (e.g., a voltage line for providing a high voltage level signal VDD), and the second electrode of the third transistor T3 may be electrically connected to an anode of a light emitting element D1, so that a driving current may be generated according to a voltage signal to drive the light emitting element D1 to emit light. For example, the light emitting element D1 may be an organic light emitting diode (OLED).

Both ends of the storage capacitor Cst are respectively connected between the gate electrode and the source electrode of the third transistor T3, so as to store the voltage signal input by the data signal line. For example, one end of the storage capacitor Cst is electrically connected to the node GN, and another end of the storage capacitor Cst is electrically connected to a node SN. That is, one end of the storage capacitor Cst, the second electrode of the first transistor T1 and the gate electrode of the third transistor T3 are electrically connected to the node GN, and another end of the storage capacitor Cst, the second electrode of the third transistor T3 and the anode of the light emitting element D1 are electrically connected to the node SN.

The second transistor T2 has a gate electrode electrically connected to A second gate line GL2, a first electrode electrically connected to A sensing signal line SL, and a second electrode electrically connected to the node SN.

The anode of the light emitting element D1 is electrically connected to the node SN, and the cathode of the light emitting element D1 is electrically connected to a second voltage line (e.g., a voltage line for providing a second voltage signal VSS). The first voltage signal VDD and the second voltage signal VSS are DC voltage signals, which are used to provide necessary voltages for driving the light emitting element D1 to emit light. For example, the first voltage signal VDD may be a high voltage level signal, and the second voltage signal VSS may be a low voltage level signal.

Figure 3:
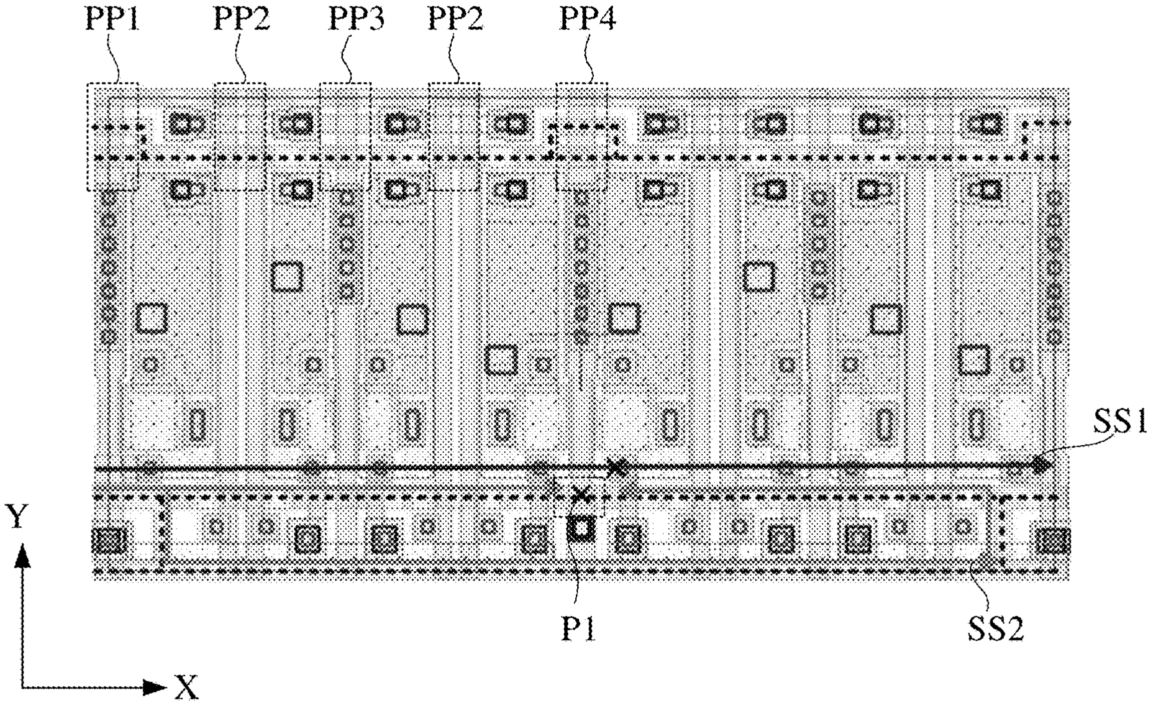
FIG. 3 schematically shows a schematic diagram of an operating state of the display substrate shown in FIG. 2 in a case of abnormality at a cross-wire position.

FIG. 3 schematically shows a schematic diagram of an operating state of the display substrate shown in FIG. 2 in a case of abnormality at a cross-wire position. Referring to FIG. 2 and FIG. 3 in combination, the display substrate includes a plurality of signal lines. For example, the plurality of signal lines include: the first gate line GL1 used to provide a scanning signal to the first transistor T1, the second gate line GL2 used to provide a scanning signal to the second transistor T2, the data signal line DL used to provide a data signal, the first voltage line VDDL used to provide the first voltage signal VDD, the sensing signal line SL used to provide a sensing voltage signal, and an auxiliary cathode line AVL used to transmit the second voltage signal VSS.

Exemplarily, in the embodiments of the present disclosure, the first gate line GL1 and the second gate line GL2 may extend in the first direction X, and the data signal line DL, the first voltage line VDDL, the sensing signal line SL and the auxiliary cathode line AVL may extend in the second direction Y. At least one of the first gate line GL1 and the second gate line GL2 overlaps with at least one of the data signal line DL, the first voltage line VDDL, the sensing signal line SL and the auxiliary cathode line AVL. In an actual layout design, the first gate line GL1 and the second gate line GL2 are located in at least one conductive film layer, and the data signal line DL, the first voltage line VDDL, the sensing signal line SL and the auxiliary cathode line AVL are located in at least another conductive film layer, that is, at least one of the first gate line GL1 and the second gate line GL2 is located in a different conductive film layer from at least one of the data signal line DL, the first voltage line VDDL, the sensing signal line SL and the auxiliary cathode line AVL. In other words, at least one of the first gate line GL1 and the second gate line GL2 has a cross-wire position with at least one of the data signal line DL, the first voltage line VDDL, the sensing signal line SL and the auxiliary cathode line AVL. At the cross-wire position, at least one of the first gate line GL1 and the second gate line GL2 overlaps partially with at least one of the data signal line DL, the first voltage line VDDL, the sensing signal line SL and the auxiliary cathode line AVL.

The inventors found through researches that a possibility of short circuit, open circuit and other bad processes between circuits at a cross-wire position is higher than other positions. In the embodiments of the present disclosure, in view of the possible bad process at the cross-wire position, a double-wire design is adopted for some signal lines. Accordingly, when a short circuit, an open circuit and other bad processes occur at the cross-wire position, for example, when a short circuit at the cross-wire position is found in a test stage of the display substrate, a position of the bad process such as short circuit, open circuit and so on may be cut off, and a normal signal line in the double-wire design may operate, so that a product yield may be improved. For example, referring to FIG. 2 and FIG. 3, the double-wire design is adopted at some positions of the first gate line GL1. In the test stage, a short circuit was found at a cross-wire position P1 of a gate sub-line (e.g., an upper gate sub-line in FIG. 2 and FIG. 3) of the first gate line GL1 and the auxiliary cathode line AVL, that is, a first signal transmission path SS1 was abnormal. In this case, the upper gate sub-line of the first gate line GL1 may be cut off at the cross-wire position P1, and the scanning signal may be transmitted normally through a second signal transmission path SS2 by means of a lower gate sub-line. In this way, the product yield may be improved.

Figure 5:
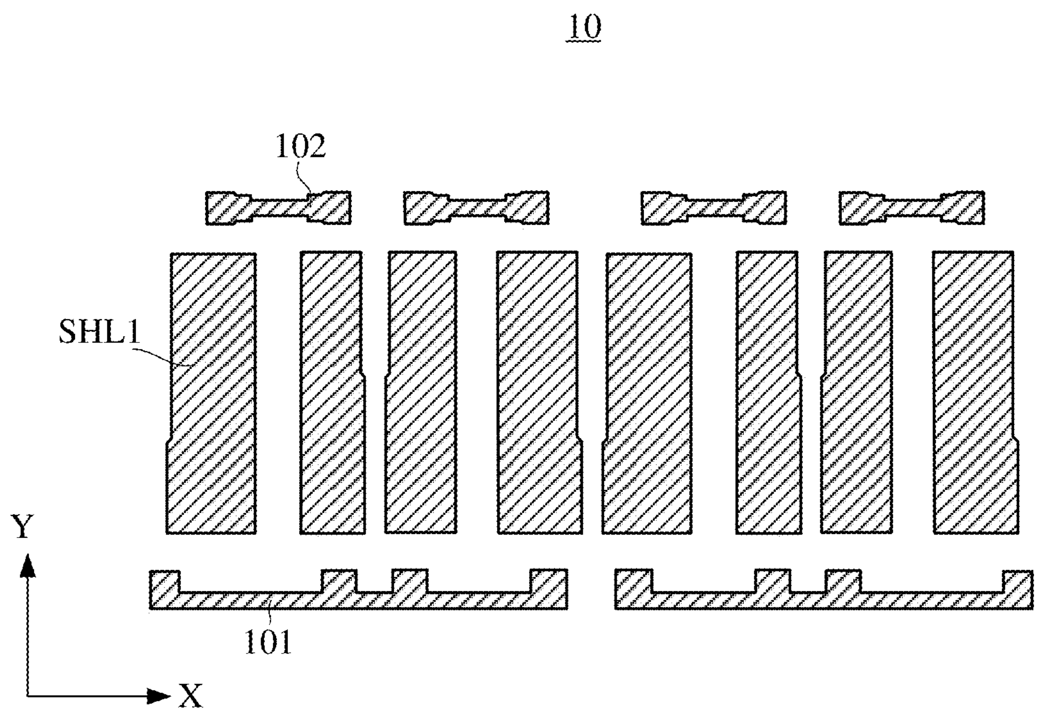
FIG. 5 to FIG. 13 show partial plan views of the display substrate according to some embodiments of the present disclosure respectively, in which a plan view of a pixel driving circuit of a pixel unit group included in the display substrate is schematically shown, wherein, FIG. 5 schematically shows a partial plan view of a first conductive film layer, FIG. 6 schematically shows a partial plan view of a semiconductor film layer, FIG. 7 schematically shows a partial plan view of a combination of the first conductive film layer and the semiconductor film layer, FIG. 8 schematically shows a partial plan view of a second conductive film layer, FIG. 9 schematically shows a partial plan view of a combination of the first conductive film layer, the semiconductor film layer and the second conductive film layer, FIG. 10 schematically shows a partial plan view of a first insulation film layer, FIG. 11A schematically shows a partial plan view of a combination of the first conductive film layer, the semiconductor film layer, the second conductive film layer and the first insulation film layer, FIG. 11B schematically shows a partial enlarged view of a relative positional relationship between a first via hole and a connecting line in FIG. 11A, FIG. 12 schematically shows a partial plan view of a third conductive film layer, and FIG. 13 schematically shows a partial plan view of a combination of the first conductive film layer, the semiconductor film layer, the second conductive film layer, the first insulation film layer and the third conductive film layer.
Figure 6:
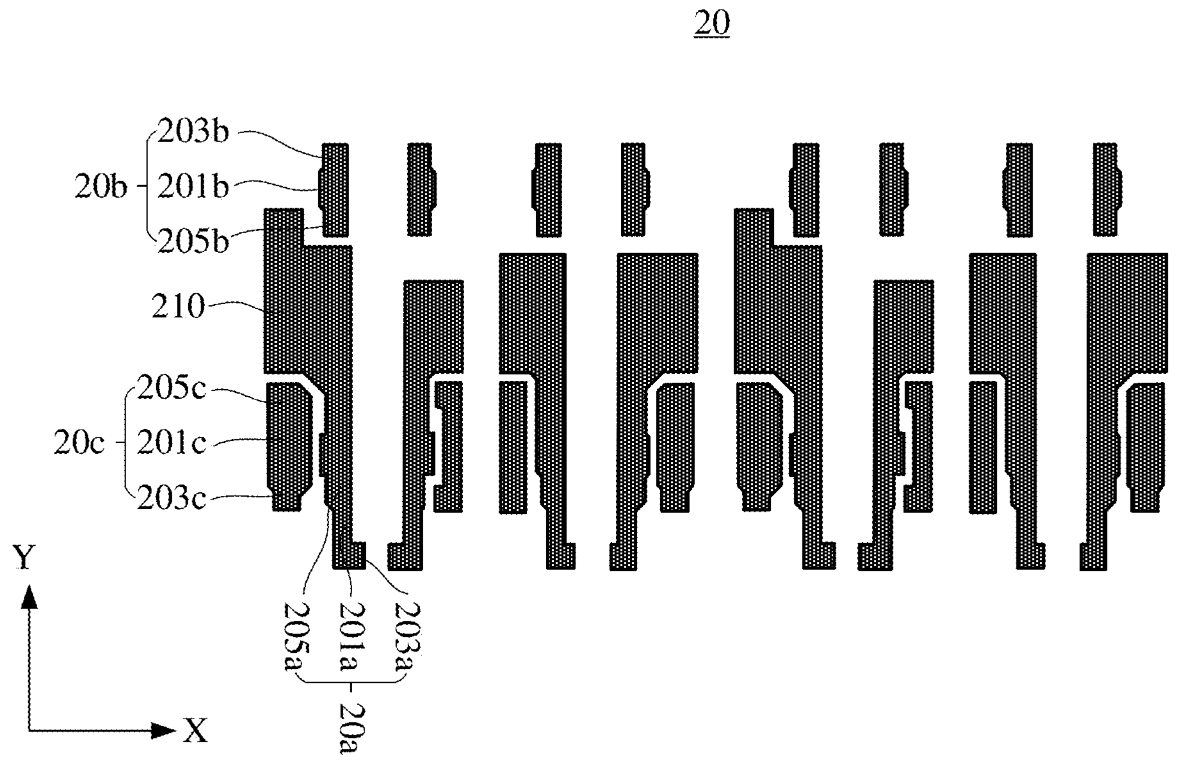
Figure 7:
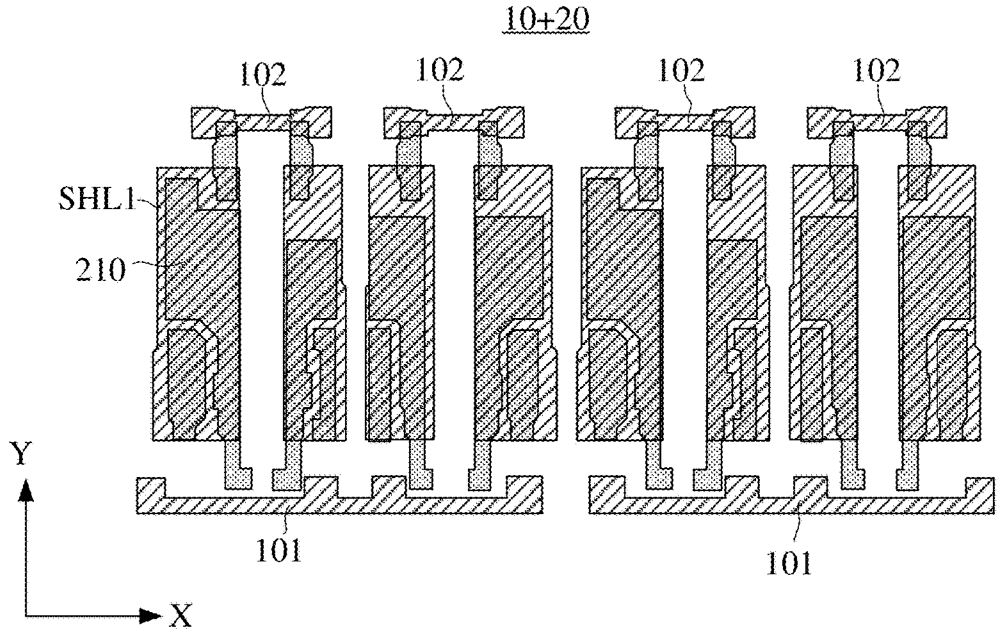
Figure 8:
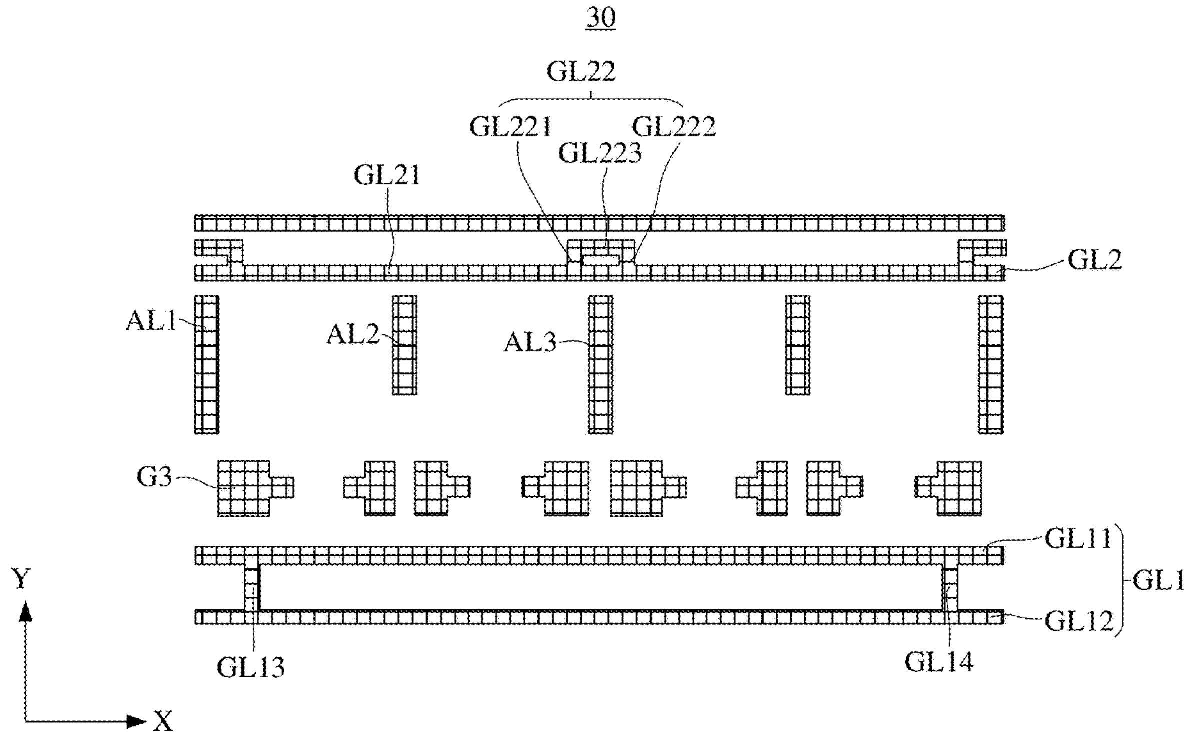
Figure 9:
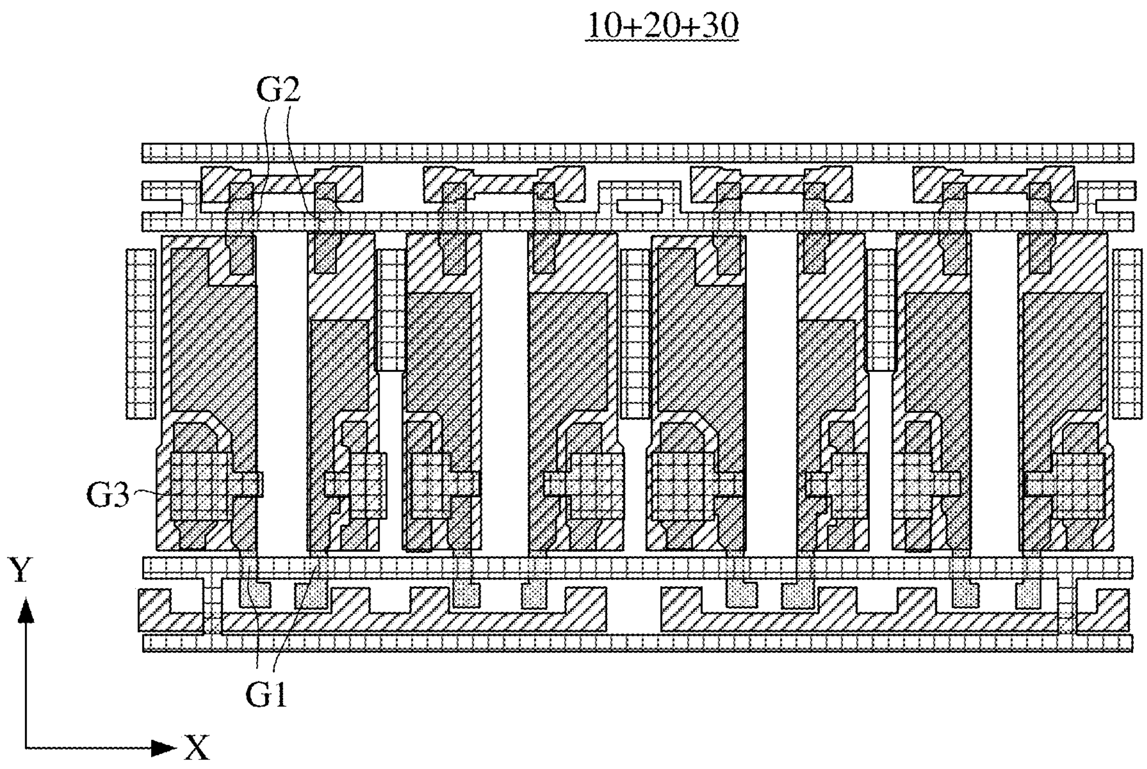
Figure 10:
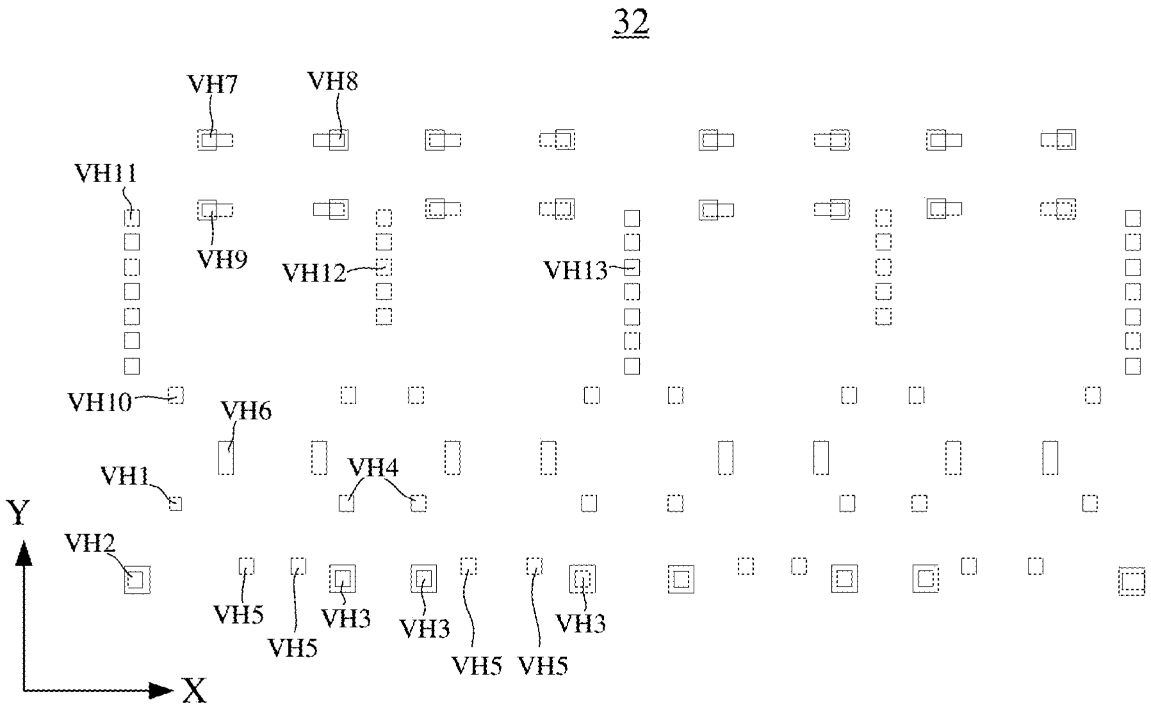
Figure 11A:
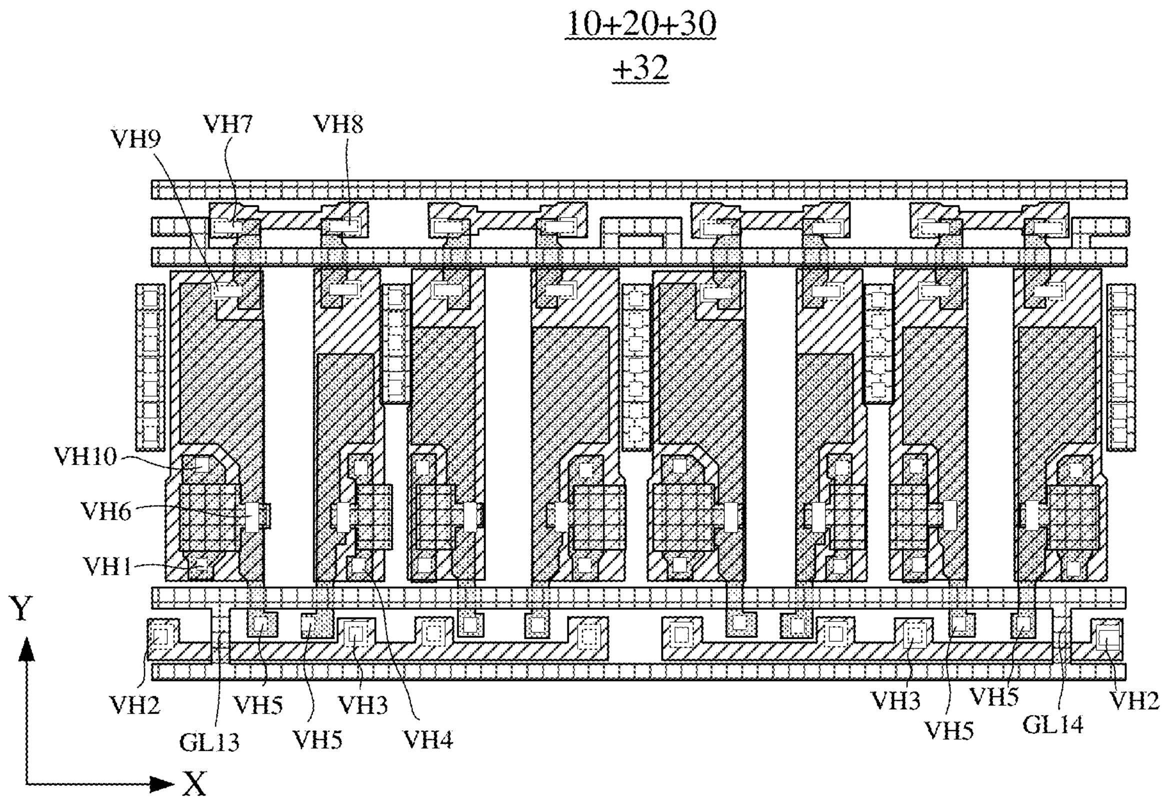
Figure 11B:
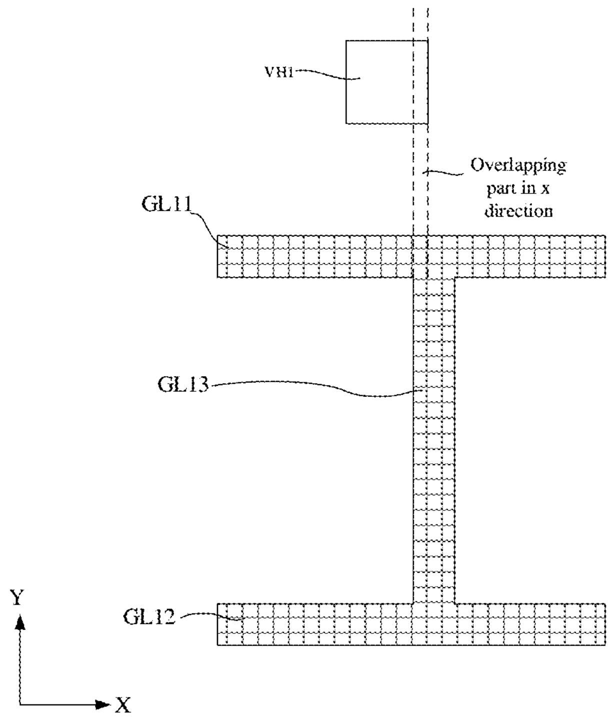
Figure 12:
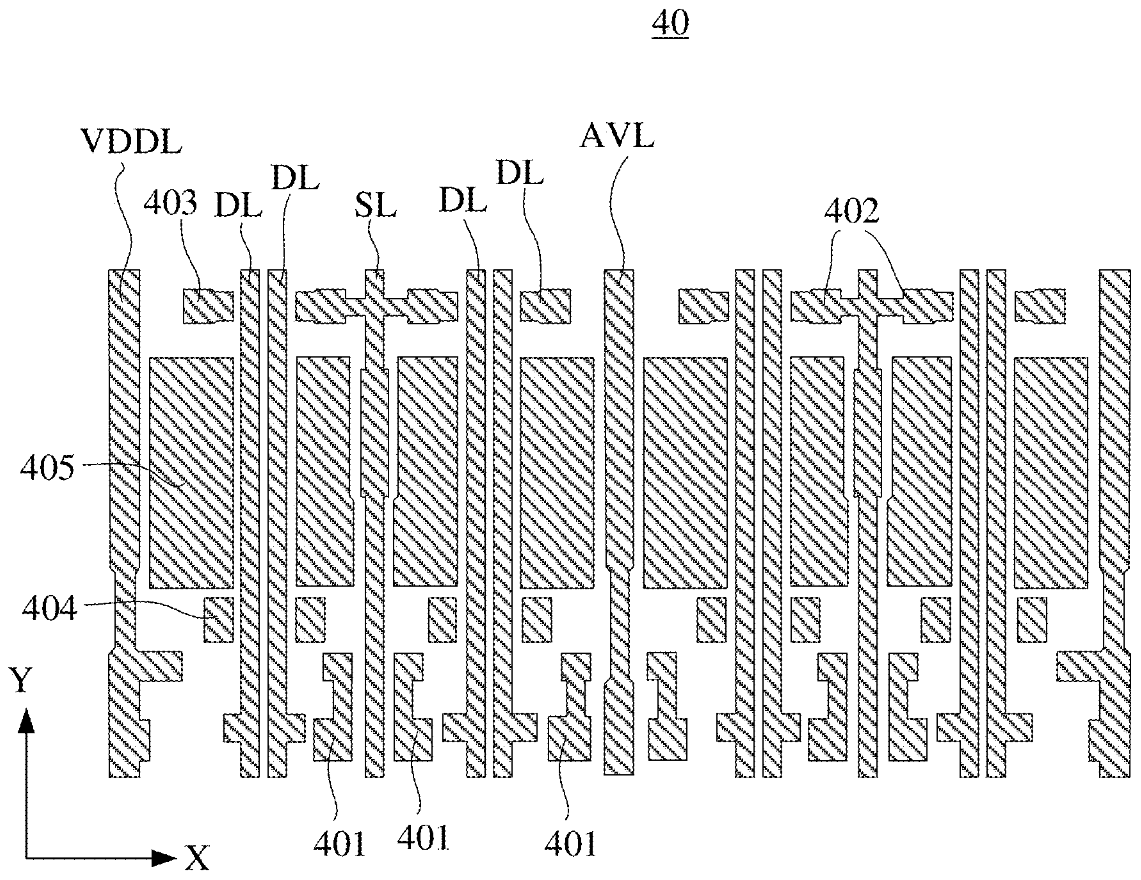
Figure 13:
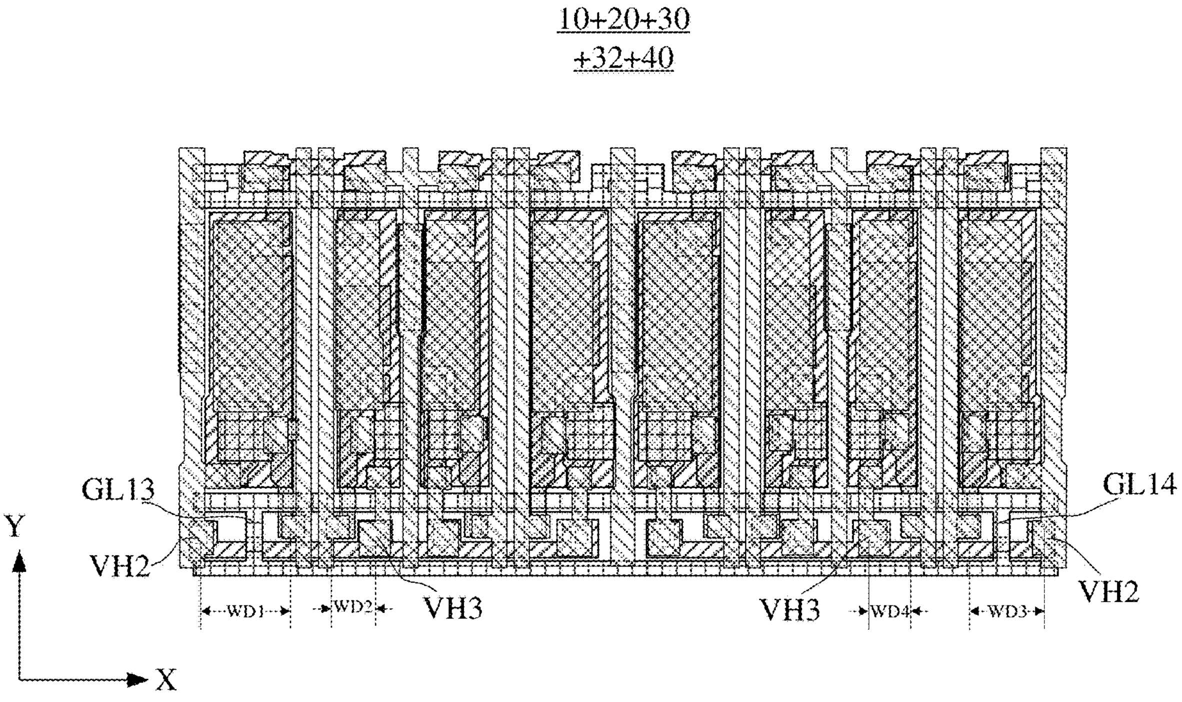
Figure 14:
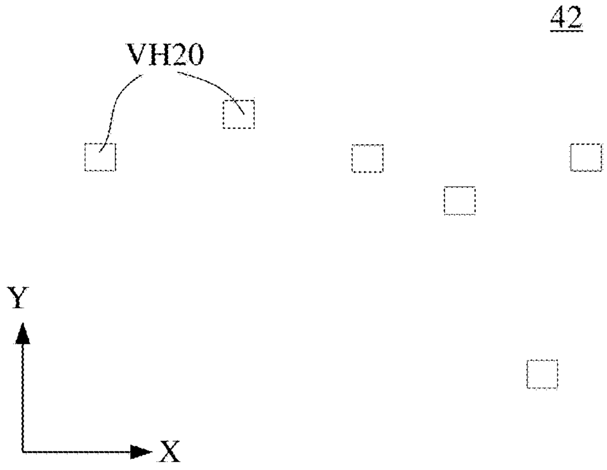
FIG. 14 shows a partial plan view of the display substrate according to some embodiments of the present disclosure, in which a plan view of a second insulation film layer of a pixel unit group included in the display substrate is schematically shown.
Figure 15A:
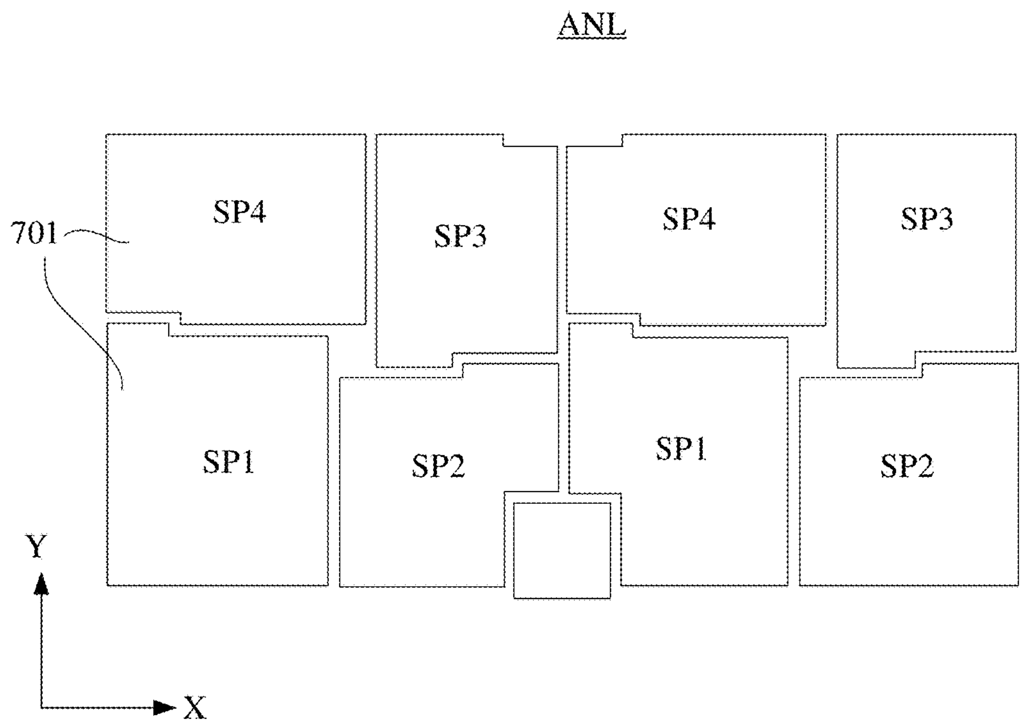
FIG. 15A shows a partial plan view of the display substrate according to some embodiments of the present disclosure, in which a plan view of a first electrode layer of a pixel unit group included in the display substrate is schematically shown.
Figure 15B:
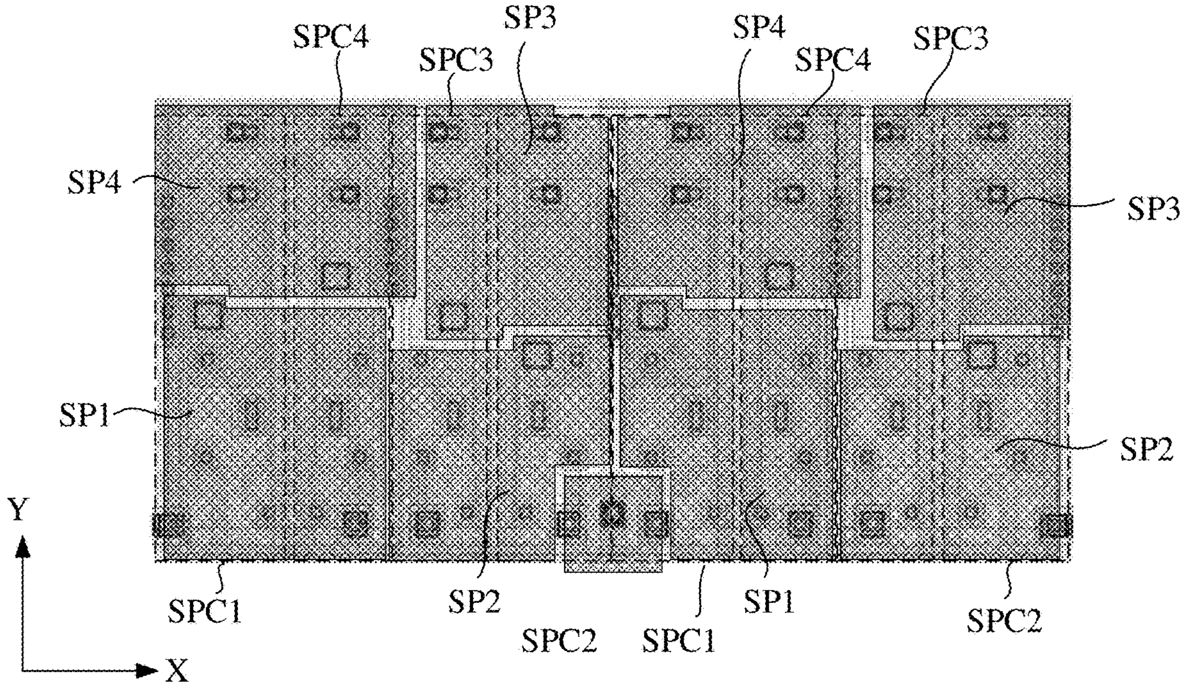
FIG. 15B shows a partial plan view of the display substrate according to some embodiments of the present disclosure, in which a plan view of the first electrode layer and a lower pixel driving circuit of a pixel unit group included in the display substrate is schematically shown.
Figure 16:
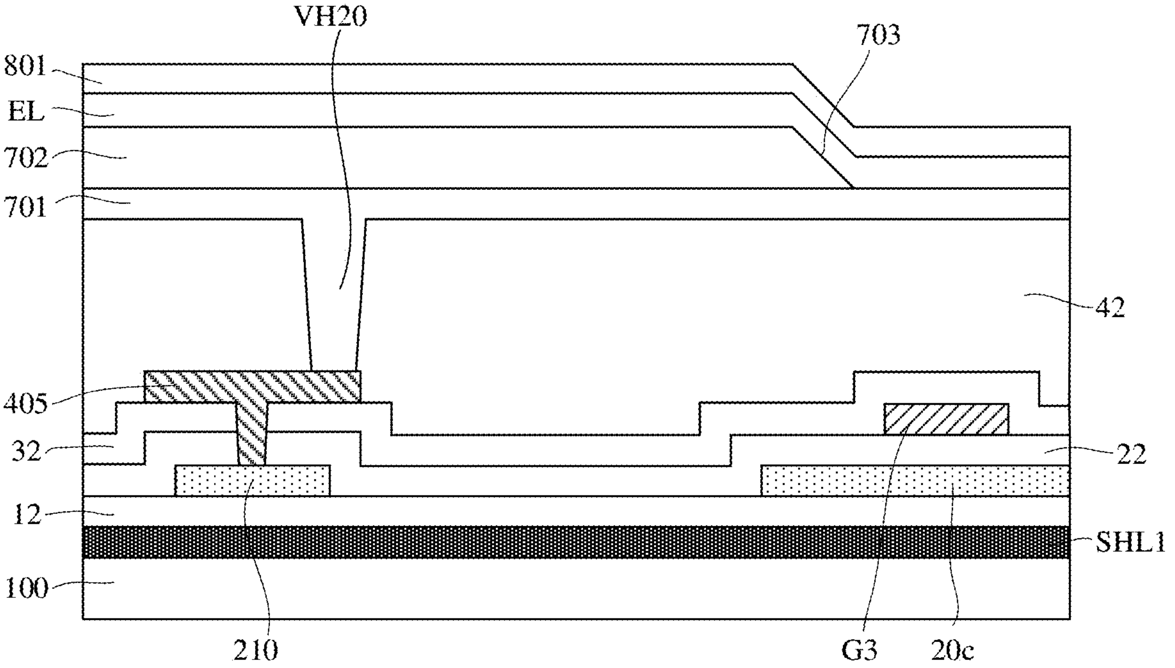
FIG. 16 shows a cross-sectional view taken along line AA' in FIG. 2.

FIG. 5 to FIG. 13 show partial plan views of the display substrate according to some embodiments of the present disclosure respectively, in which a plan view of a pixel driving circuit of a pixel unit group included in the display substrate is schematically shown, wherein, FIG. 5 schematically shows a partial plan view of a first conductive film layer, FIG. 6 schematically shows a partial plan view of a semiconductor film layer, FIG. 7 schematically shows a partial plan view of a combination of the first conductive film layer and the semiconductor film layer, FIG. 8 schematically shows a partial plan view of a second conductive film layer, FIG. 9 schematically shows a partial plan view of a combination of the first conductive film layer, the semiconductor film layer and the second conductive film layer, FIG. 10 schematically shows a partial plan view of a first insulation film layer, FIG. 11A schematically shows a partial plan view of a combination of the first conductive film layer, the semiconductor film layer, the second conductive film layer and the first insulation film layer, FIG. 11B schematically shows a partial enlarged view of a relative positional relationship between a first via hole and a connecting line in FIG. 11A, FIG. 12 schematically shows a partial plan view of a third conductive film layer, and FIG. 13 schematically shows a partial plan view of a combination of the first conductive film layer, the semiconductor film layer, the second conductive film layer, the first insulation film layer and the third conductive film layer. FIG. 14 shows a partial plan view of the display substrate according to some embodiments of the present disclosure, in which a plan view of a second insulation film layer of a pixel unit group included in the display substrate is schematically shown. FIG. 15A shows a partial plan view of the display substrate according to some embodiments of the present disclosure, in which a plan view of a first electrode layer of a pixel unit group included in the display substrate is schematically shown. FIG. 15B shows a partial plan view of the display substrate according to some embodiments of the present disclosure, in which a plan view of the first electrode layer and a lower pixel driving circuit of a pixel unit group included in the display substrate is schematically shown. FIG. 16 shows a cross-sectional view taken along line AA' in FIG. 2.

It should be noted that in FIG. 10 and FIG. 14, via holes in the insulation film layer are mainly schematically shown, and an insulation material of the insulation film layer is not shown, so that positions of the via holes in the insulation film layer may be highlighted.

Referring to FIG. 5 to FIG. 16 in combination, the display substrate may include a plurality of conductive film layers, a semiconductor film layer, and a plurality of insulation film layers. For the convenience of description, the plurality of conductive film layers are described as a first conductive film layer, a second conductive film layer and a third conductive film layer respectively. For example, FIG. 5 shows a part of the first conductive film layer 10. The first conductive film layer 10 may be a film layer where a first shading portion SHL1 is located. FIG. 6 shows a part of the semiconductor film layer 20. FIG. 8 shows a part of the second conductive film layer 30. The second conductive film layer 30 may be a film layer where the gate line and the gate electrode of the transistor are located, that is, it may be a conductive film layer formed of a gate material. FIG. 12 shows a part of the third conductive film layer 40. The third conductive film layer 40 may be a film layer where the data signal line DL and so on are located, that is, it may be a conductive film layer formed of a source/drain material.

For example, the first conductive film layer 10, the semiconductor film layer 20, the second conductive film layer 30 and the third conductive film layer 40 are stacked in sequence on the base substrate of the display substrate.

The display substrate may include a plurality of signal lines, as shown in FIG. 2, FIG. 3, FIG. 12 and FIG. 13. The plurality of signal lines may include the first gate line GL1, the second gate line GL2, the data signal line DL, the first voltage line VDDL, the sensing signal line SL, and the auxiliary cathode line AVL. The first gate line GL1 and the second gate line GL2 may be located in the second conductive film layer 30, and the data signal line DL, the first voltage line VDDL, the sensing signal line SL and the auxiliary cathode line AVL may be located in the third conductive film layer 40.

In the embodiments shown in FIG. 2, FIG. 3, FIG. 12 and FIG. 13, the first gate line GL1 and the second gate line GL2 may extend substantially in the first direction X, and the first gate line GL1 and the second gate line GL2 are spaced apart in the second direction Y. The data signal line DL, the first voltage line VDDL, the sensing signal line SL and the auxiliary cathode line AVL may extend substantially in the second direction Y, and any two of the data signal line DL, the first voltage line VDDL, the sensing signal line SL and the auxiliary cathode line AVL are spaced apart in the first direction X.

In the illustrated embodiments, a pixel unit group is schematically shown. For example, a pixel unit group includes a first pixel unit PX1 and a second pixel unit PX2 that are arranged adjacent to each other in the first direction.

Each of the first pixel unit PX1 and the second pixel unit PX2 includes a plurality of sub-pixels, for example, four sub-pixels, including a first sub-pixel SP1, a second sub-pixel SP2, a third sub-pixel SP3 and a fourth sub-pixel SP4. The pixel driving circuits of the eight sub-pixels are arranged side by side in the first direction X, that is, the pixel driving circuits of the eight sub-pixels are arranged in a row. In a pixel unit group, the pixel driving circuits of the four sub-pixels of the first pixel unit PX1 are arranged in the first direction X in an order of the first sub-pixel SP1, the fourth sub-pixel SP4, the third sub-pixel SP3 and the second sub-pixel SP2, and the pixel driving circuits of the four sub-pixels of the second pixel unit PX2 are arranged in the first direction X in an order of the first sub-pixel SP1, the fourth sub-pixel SP4, the third sub-pixel SP3 and the second sub-pixel SP2.

In a pixel unit group, each pixel unit shares a first voltage line VDDL and a sensing signal line SL, that is, the four sub-pixels of the first pixel unit PX1 share a first voltage line VDDL and a sensing signal line SL, and the four sub-pixels of the second pixel unit PX2 share a first voltage line VDDL and a sensing signal line SL. The eight sub-pixels of a pixel unit group share an auxiliary cathode line AVL.

For example, the sub-pixels in each row of pixel units share a first gate line GL1 and a second gate line GL2, and each column of sub-pixels share a data signal line DL. That is, in a pixel unit group, the eight sub-pixels share a first gate line GL1 and a second gate line GL2, and the eight sub-pixels have respective data signal lines DL.

As shown in FIG. 2, FIG. 3, FIG. 12 and FIG. 13, in a pixel unit group, the signal lines extending in the second direction Y are arranged in an order of one first voltage line VDDL, two data signal lines DL, one sensing signal line SL, two data signal lines DL, one auxiliary cathode line AVL, two data signal lines DL, one sensing signal line SL, two data signal lines DL and one first voltage line VDDL. The first voltage line, the data signal lines and the sensing signal line of the first pixel unit PX1 and the first voltage line, the data signal lines and the sensing signal line of the second pixel unit PX2 are symmetrically arranged in the first direction X with respect to the auxiliary cathode line AVL shared by the two pixel units. With such arrangement, the layout design may be simplified.

For the first pixel unit PX1 in a pixel unit group, the first voltage line VDDL used to provide the first voltage signal to each sub-pixel of the first pixel unit is arranged on one side of each sub-pixel of the first pixel unit, for example, on a left side of the first sub-pixel SP1, the two data signal lines DL used to provide the data signals respectively to the first sub-pixel SP1 and the fourth sub-pixel SP4 are arranged between the first sub-pixel SP1 and the fourth sub-pixel SP4, the sensing signal line SL used to provide the sensing signal is arranged between the fourth sub-pixel SP4 and the third sub-pixel SP3, and the two data signal lines DL used to provide the data signals respectively to the third sub-pixel SP3 and the second sub-pixel SP2 are arranged between the third sub-pixel SP3 and the second sub-pixel SP2.

For the second pixel unit PX2 in a pixel unit group, the first voltage line VDDL used to provide the first voltage signal to each sub-pixel of the second pixel unit is arranged on one side of each sub-pixel of the second pixel unit, for example, on a right side of the second sub-pixel SP2, the two data signal lines DL used to provide the data signals respectively to the first sub-pixel SP1 and the fourth sub-pixel SP4 are arranged between the first sub-pixel SP1 and the fourth sub-pixel SP4, the sensing signal line SL used to provide the sensing signal is arranged between the fourth sub-pixel SP4 and the third sub-pixel SP3, and the two data signal lines DL used to provide the data signals respectively to the third sub-pixel SP3 and the second sub-pixel SP2 are arranged between the third sub-pixel SP3 and the second sub-pixel SP2.

For a pixel unit group, the shared auxiliary cathode line AVL is arranged between the first pixel unit PX1 and the second pixel unit PX2, for example, between the second sub-pixel SP2 of the first pixel unit PX1 and the first sub-pixel SP1 of the second pixel unit PX2.

In the embodiments of the present disclosure, for a sub-pixel, a region surrounded by the signal lines extending in the first direction X to provide signals to the sub-pixel and the signal lines extending in the second direction Y to provide signals to the sub-pixel forms a pixel driving circuit region (also referred to as a region where the pixel driving circuit is located) of the sub-pixel.

For example, for the first sub-pixel SP1 of the first pixel unit PX1 in a pixel unit group, a region surrounded by the first gate line GL1 used to provide a first scanning signal to the first sub-pixel SP1, the second gate line GL2 used to provide a second scanning signal to the first sub-pixel SP1, the first voltage line VDDL used to provide a first voltage signal to the first sub-pixel SP1 and the data signal line DL used to provide a data signal to the first sub-pixel SP1 forms the pixel driving circuit region of the first sub-pixel SP1, which may be, for example, a rectangular region. For the fourth sub-pixel SP4 of the first pixel unit PX1 in a pixel unit group, a region surrounded by the first gate line GL1 used to provide a first scanning signal to the fourth sub-pixel SP4, the second gate line GL2 used to provide a second scanning signal to the fourth sub-pixel SP4, the data signal line DL used to provide a data signal to the fourth sub-pixel SP4 and the sensing signal line SL forms the pixel driving circuit region of the fourth sub-pixel SP4, which may be, for example, a rectangular region. For the third sub-pixel SP3 of the first pixel unit PX1 in a pixel unit group, a region surrounded by the first gate line GL1 used to provide a first scanning signal to the third sub-pixel SP3, the second gate line GL2 used to provide a second scanning signal to the third sub-pixel SP3, the data signal line DL used to provide a data signal to the third sub-pixel SP3 and the sensing signal line SL forms the pixel driving circuit region of the third sub-pixel SP3, which may be, for example, a rectangular region. For the second sub-pixel SP2 of the first pixel unit PX1 in a pixel unit group, a region surrounded by the first gate line GL1 used to provide a first scanning signal to the second sub-pixel SP2, the second gate line GL2 used to provide a second scanning signal to the second sub-pixel SP2, the data signal line DL used to provide a data signal to the second sub-pixel SP2 and the auxiliary cathode line AVL forms the pixel driving circuit region of the second sub-pixel SP2, which may be, for example, a rectangular region.

For example, for the second sub-pixel SP2 of the second pixel unit PX1 in a pixel unit group, a region surrounded by the first gate line GL1 used to provide a first scanning signal to the second sub-pixel SP2, the second gate line GL2 used to provide a second scanning signal to the second sub-pixel SP2, the first voltage line VDDL used to provide a first voltage signal to the second sub-pixel SP2 and the data signal line DL used to provide a data signal to the second sub-pixel SP2 forms the pixel driving circuit region of the second sub-pixel SP2, which may be, for example, a rectangular region. For the third sub-pixel SP3 of the second pixel unit PX2 in a pixel unit group, a region surrounded by the first gate line GL1 used to provide a first scanning signal to the third sub-pixel SP3, the second gate line GL2 used to provide a second scanning signal to the third sub-pixel SP3, the data signal line DL used to provide a data signal to the third sub-pixel SP3 and the sensing signal line SL forms the pixel driving circuit region of the third sub-pixel SP3, which may be, for example, a rectangular region. For the fourth sub-pixel SP4 of the second pixel unit PX2 in a pixel unit group, a region surrounded by the first gate line GL1 used to provide a first scanning signal to the fourth sub-pixel SP4, the second gate line GL2 used to provide a second scanning signal to the fourth sub-pixel SP4, the data signal line DL used to provide a data signal to the fourth sub-pixel SP4 and the sensing signal line SL forms the pixel driving circuit region of the fourth sub-pixel SP4, which may be, for example, a rectangular region. For the first sub-pixel SP1 of the second pixel unit PX2 in a pixel unit group, a region surrounded by the first gate line GL1 used to provide a first scanning signal to the first sub-pixel SP1, the second gate line GL2 used to provide a second scanning signal to the first sub-pixel SP1, the data signal line DL used to provide a data signal to the first sub-pixel SP1 and the auxiliary cathode line AVL forms the pixel driving circuit region of the first sub-pixel SP1, which may be, for example, a rectangular region.

In the following descriptions, unless otherwise specified, a structure of each film layer may be applied to each sub-pixel, and is not particularly limited to a structure of a sub-pixel.

Referring to FIG. 5 to FIG. 7 in combination, the display substrate may include a first shading portion SHL1, a first conductive portion 101 and a second conductive portion 102 that are located in the first conductive film layer 10. For example, the first conductive film layer 10 may be made of a metal material, such as silver, copper, aluminum, molybdenum, etc., or an alloy material of the above-mentioned metals, such as aluminum-niobium alloy, molybdenum-niobium alloy, etc., or may be multi-layer metal, such as Mo/Cu/Mo, etc., or may be a stack structure formed by metal and transparent conductive material, such as ITO/Ag/ITO, etc. The first shading portion SHL1, the first conductive portion 101 and the second conductive portion 102 are spaced apart. An area of an orthographic projection of the first shading portion SHL1 on the base substrate 100 is larger than each of an area of an orthographic projection of the first conductive portion 101 on the base substrate 100 and an area of an orthographic projection of the second conductive portion 102 on the base substrate 100. The first shading portion SHL1 may also form an electrode of the storage capacitor Cst. Therefore, the first shading portion SHL1 may be referred to as a first capacitor portion herein.

The first transistor T1, the second transistor T2 and the third transistor T3 may be formed along the semiconductor film layer 20 as shown in FIG. 6. The semiconductor film layer may have a curved or bent shape, and may include a first active layer 20*a* corresponding to the first transistor T1, a second active layer 20*b* corresponding to the second transistor T2, and a third active layer 20*c* corresponding to the third transistor T3.

The semiconductor film layer may contain materials such as amorphous silicon, polycrystalline silicon or oxide semiconductor, and may include, for example, a channel region, a source region and a drain region. The channel region may be non-doped or have a doping type different from that of the source region and the drain region, and therefore has a semiconductor property. The source region and the drain region are located on both sides of the channel region respectively, and are doped with impurities, and therefore have conductivity. The impurities may vary depending on whether the TFT is an N-type transistor or a P-type transistor. For example, in the embodiments of the present disclosure, each transistor may be an N-type thin film transistor.

The first transistor T1 includes the first active layer 20*a*. The first active layer 20*a* includes a first source region 203*a*, a first drain region 205*a*, and a first channel region 201*a* that connects the first source region 203*a* and the first drain region 205*a*. The first source region 203*a* and the first drain region 205*a* extend in two opposite directions with respect to the first channel region 201*a*.

The second transistor T2 includes the second active layer 20*b*. The second active layer includes a second source region 203*b*, a second drain region 205*b*, and a second channel region 201*b* that connects the second source region 203*b* and the second drain region 205*b*. The second source region 203*b* and the second drain region 205*b* extend in two opposite directions with respect to the second channel region 201*b*.

The third transistor T3 includes the third active layer 20*c*. The third active layer 20*c* includes a third source region 203*c*, a third drain region 205*c*, and a third channel region 201*c* that connects the third source region 203*c* and the third drain region 205*c*. The third source region 203*c* and the third drain region 205*c* extend in two opposite directions with respect to the third channel region 201*c*.

The display substrate may further include a second capacitor portion 210 located in the semiconductor film layer 20. For example, the second capacitor portion 210 and the first active layer may be a continuously extending part, that is, a combination of the two forms a whole structure. The combination of the second capacitor portion 210 and the first active layer 20*a*, the second active layer 20*b* and the third active layer 20*c* are spaced apart from each other.

As shown in FIG. 7, an orthographic projection of the second capacitor portion 210 on the base substrate 100 overlaps at least partially with an orthographic projection of the first shading portion SHL1 on the base substrate 100. The first shading portion SHL1 may serve as one electrode of the storage capacitor Cst, and the second capacitor portion 210 may serve as the other electrode of the storage capacitor Cst.

An orthographic projection of the third active layer 20*c* on the base substrate 100 overlaps at least partially with the orthographic projection of the first shading portion SHL1 on the base substrate 100. The first shading portion SHL1 may shield an influence of external factors on the third active layer 20*c*. In the embodiments of the present disclosure, the third transistor T3 serves as a driving transistor, and a shielding effect of the first shading portion SHL1 may help to maintain the stability of the performance of the third transistor T3.

Referring to FIG. 8 and FIG. 9 in combination, the display substrate may include a first gate line GL1, a second gate line GL2, a third gate G3, a first auxiliary line AL1, a second auxiliary line AL2 and a third auxiliary line AL3 that are located in the second conductive film layer 30. The second conductive film layer 30 may be formed of a gate material. For example, the gate material may include a metal material, such as Mo, Al, Cu and other metals and their alloys. The first gate line GL1, the second gate line GL2, the third gate G3, the first auxiliary line AL1, the second auxiliary line AL2 and the third auxiliary line AL3 are spaced apart from each other.

A part of the first gate line GL1 overlapping with the first active layer 20*a* of the first transistor T1 form the first gate electrode G1 of the first transistor T1. A part of the second gate line GL2 overlapping with the second active layer 20*b* of the second transistor T2 form the second gate electrode G2 of the second transistor T2. A part of the third gate G3 overlapping with the third active layer 20c of the third transistor T3 forms the third gate electrode of the third transistor T3.

As shown in FIG. 8 and FIG. 9, at least one first gate line GL1 includes a first gate sub-line GL11, a second gate sub-line GL12, and a plurality of connecting lines GL13 and GL14. The first gate sub-line GL11 and the second gate sub-line GL12 extend in the first direction X, and the plurality of connecting lines GL13 and GL14 extend in the second direction Y. The first gate sub-line GL11 and the second gate sub-line GL12 are spaced apart in the second direction Y, and the plurality of connecting lines GL13 and GL14 are spaced apart in the first direction X. Each of the connecting lines GL13 and GL14 connects the first gate sub-line GL11 and the second gate sub-line GL12.

For example, the plurality of connecting lines may include a first connecting line GL13 and a second connecting line GL14. The first connecting line GL13 is located in a region where the first pixel unit PX1 in a pixel unit group is located, and the second connecting line GL14 is located in a region where the second pixel unit PX2 in the same pixel unit group is located. For example, the first connecting line GL13 is located in a region where the pixel driving circuit of the first sub-pixel SP1 of the first pixel unit PX1 is located, and the second connecting line GL14 is located in a region where the pixel driving circuit of the second sub-pixel SP2 of the second pixel unit PX2 is located.

For example, at least one second gate line GL2 includes a gate line body portion GL21 and a gate line additional portion GL22 connected to the gate line body portion GL21. The at least one second gate line includes a ring structure surrounded by the gate line body portion GL21 and the gate line additional portion GL22.

For example, the gate line additional portion GL22 includes a first additional portion GL221, a second additional portion GL222, and a third additional portion GL223. The first additional portion GL221 and the second additional portion GL222 extend from the gate line body portion GL21 in the second direction Y. The third additional portion GL223 extends in the first direction X. One end of the first additional portion GL221 is connected to the gate line body portion GL21, another end of the first additional portion GL221 is connected to one end of the third additional portion GL223, another end of the third additional portion GL223 is connected to one end of the second additional portion GL222, and another end of the second additional portion GL222 is connected to the gate line body portion GL21.

Referring to FIG. 10 to FIG. 13 in combination, the display substrate may include a data signal line DL, a first voltage line VDDL, a sensing signal line SL, an auxiliary cathode line AVL, a first conductive connecting portion 401, a second conductive connecting portion 402, a third conductive connecting portion 403, a fourth conductive connecting portion 404 and a third capacitor portion 405 that are located in the third conductive film layer 40.

It should be understood that the display substrate may further include a plurality of insulation film layers located between any adjacent two of the base substrate 100, the first conductive film layer 10, the semiconductor film layer 20, the second conductive film layer 30, the third conductive film layer 40 and the fourth conductive film layer 50. These insulation layers will be described below with reference to cross-sectional views. A via hole or groove may be formed in the insulation layer to expose at least part of one of the first conductive film layer 10, the semiconductor film layer 20, the second conductive film layer 30 and the third conductive film layer 40, so as to achieve an electrical connection between components located in different film layers.

Referring to FIG. 5 to FIG. 16, The display substrate may include a base substrate 100, a first conductive film layer 10 arranged on the base substrate 100, a buffer layer 12 arranged on a side of the first conductive film layer 10 away from the base substrate 100, a semiconductor film layer 20 arranged on a side of the buffer layer 12 away from the base substrate 100, a gate insulation film layer 22 arranged on a side of the semiconductor film layer 20 away from the base substrate 100, a second conductive film layer 30 arranged on a side of the gate insulation film layer 22 away from the base substrate 100, a first insulation film layer (such as interlayer dielectric layer) 32 arranged on a side of the second conductive film layer 30 away from the base substrate 100, a third conductive film layer 40 arranged on a side of the first insulation film layer 32 away from the base substrate 100, a second insulation film layer 42 arranged on a side of the third conductive film layer 40 away from the base substrate 100, a first electrode layer ANL arranged on a side of the second insulation film layer 42 away from the base substrate 100, and a pixel definition layer 702 arranged on a side of the first electrode layer ANL away from the base substrate 100.

It should be noted that each of the above-mentioned insulation film layers may have a single-layer structure or a stacked-layer structure formed by a plurality of insulation film layers. For example, the second insulation film layer 42 may include two passivation layers, or include one passivation layer and one planarization layer.

For example, the first electrode layer ANL may include a first electrode 701 of the light emitting element. The first electrode layer ANL may contain a conductive material such as ITO. The pixel definition layer 702 may include an opening 703. The display substrate may further include: a luminescent material layer EL arranged on a side of the pixel definition layer 702 away from the base substrate 100 and located in the opening 703; and a second electrode layer arranged on a side of the luminescent material layer EL away from the base substrate 100. For example, the second electrode layer may include a second electrode 801 of the light emitting element. For example, the second electrode layer may contain an opaque conductive material.

In some exemplary embodiments, the first electrode 701 may be an anode of the light emitting element (e.g., OLED), and the second electrode 801 may be a cathode of the light emitting element.

Referring to FIG. 5 to FIG. 16 in combination, the display substrate may include a first via hole VH1, a second via hole VH2, a third via hole VH3, a fourth via hole VH4, a fifth via hole VH5, a sixth via hole VH6, a seventh via hole VH7, an eighth via hole VH8, a ninth via hole VH9, a tenth via hole VH10, an eleventh via hole VH11, a twelfth via hole VH12, and a thirteenth via hole VH13.

It should be noted that herein, the expression "via hole" should be understood as a structure for electrically connecting the components in at least two different conductive film layers. For example, a via hole in an insulation film layer exposes at least part of a component in a conductive film layer below the insulation film layer. When a conductive film layer is formed above the insulation film layer, a conductive structure (e.g., conductive plug) may be formed in the via hole in the insulation film layer, and the via hole (including conductive plug) in the insulation film layer may electrically connect a component in the conductive film layer above the insulation film layer with the component in the conductive film layer below the insulation film layer. In addition, the expression "via hole" may include various forms, including but not limited to through hole, groove, opening, and so on.

For example, the first via hole VH1 exposes at least part of the third source region 203*c* of the third transistor T3. The first voltage line VDDL has a first protruding portion. An orthographic projection of the first protruding portion of the first voltage line VDDL on the base substrate 100, an orthographic projection of the first via hole VH1 on the base substrate 100 and an orthographic projection of the third source region 203*c* on the base substrate 100 overlap at least partially with each other. Accordingly, the first voltage line VDDL is electrically connected to the first electrode (e.g., the source electrode) of the third transistor T3 through the first via hole VH1. In this way, the first voltage signal VDD may be provided to the first electrode (e.g., the source electrode) of the third transistor T3 of at least one sub-pixel.

For example, in at least one pixel unit group, the third active layer 20*c* of the pixel driving circuit of the first sub-pixel SP1 of the first pixel unit PX1 is electrically connected to the first voltage line VDDL through the first via hole VH1, and the third active layer 20*c* of the pixel driving circuit of the second sub-pixel SP2 of the second pixel unit PX2 is electrically connected to the first voltage line VDDL through the first via hole VH1.

In the first sub-pixel SP1 of the first pixel unit PX1, an orthographic projection of the first via hole VH1 on the base substrate 100 and an orthographic projection of the first connecting line GL13 on the base substrate 100 are spaced apart from each other in the second direction Y, and overlap at least partially with each other in the first direction X. As shown in FIG. 11B, the orthographic projection of the first via hole VH1 on the base substrate 100 and the orthographic projection of the first connecting line GL13 on the base substrate 100 have an overlapping part in the first direction X.

In the second sub-pixel SP2 of the second pixel unit PX2, an orthographic projection of the first via hole VH1 on the base substrate 100 and an orthographic projection of the second connecting line GL14 on the base substrate 100 are spaced apart from each other in the second direction Y, and overlap at least partially with each other in the first direction X. Similar to that shown in FIG. 11B, the orthographic projection of the first via hole VH1 on the base substrate 100 and the orthographic projection of the second connecting line GL14 on the base substrate 100 have an overlapping part in the first direction X.

The second via hole VH2 exposes at least part of the first conductive portion 101. The first voltage line VDDL has a second protruding portion. An orthographic projection of the second protruding portion of the first voltage line VDDL on the base substrate 100, an orthographic projection of the second via hole VH2 on the base substrate 100 and an orthographic projection of the first conductive portion 101 on the base substrate 100 overlap at least partially with each other. Accordingly, the first voltage line VDDL is electrically connected to one end of the first conductive portion 101 through the second via hole VH2.

A plurality of third via holes VH3 expose at least parts of the first conductive portion 101 respectively. One ends of a plurality of first conductive connecting portions 401 are electrically connected to the first conductive portion 101 through the plurality of third via holes VH3 respectively. A plurality of fourth via holes VH4 expose at least parts of the third source regions 203*c* of the third transistors T3 of a plurality of sub-pixels respectively. Another ends of the plurality of first conductive connecting portion 401 are electrically connected to the first electrodes (e.g., the source electrodes) of the third transistors T3 of a plurality of sub-pixels through the plurality of fourth via holes VH4 respectively. In this way, the first voltage signal VDD may be provided to the first electrodes (e.g., the source electrodes) of the third transistors T3 of at least other sub-pixels.

In the embodiments of the present disclosure, in a pixel unit group, the first conductive connecting portions 401 need to be arranged in the regions where the pixel driving circuits of the fourth sub-pixel SP4, the third sub-pixel SP3 and the second sub-pixel SP2 of the first pixel unit PX1 are located, and a space between the first gate sub-line GL11 and the second gate sub-line GL12 is limited in the regions where the pixel driving circuits of the fourth sub-pixel SP4, the third sub-pixel SP3 and the second sub-pixel SP2 of the first pixel unit PX1 are located. Similarly, the first conductive connecting portions 401 need to be arranged in the regions where the pixel driving circuits of the first sub-pixel SP1, the fourth sub-pixel SP4 and the third sub-pixel SP3 of the second pixel unit PX2 are located, and a space between the first gate sub-line GL11 and the second gate sub-line GL12 is limited in the regions where the pixel driving circuits of the first sub-pixel SP1, the fourth sub-pixel SP4 and the third sub-pixel SP3 of the second pixel unit PX2 are located. In the embodiments of the present disclosure, in a pixel unit group, it is not needed to provide the first conductive connecting portion 401 in the region where the pixel driving circuit of the first sub-pixel SP1 of the first pixel unit PX1 is located, and it is not needed to provide the first conductive connecting portion 401 in the region where the pixel driving circuit of the second sub-pixel SP2 of the second pixel unit PX2 is located. Accordingly, the space between the first gate sub-line GL11 and the second gate sub-line GL12 is large in the regions where the pixel driving circuit of the first sub-pixel SP1 of the first pixel unit PX1 and the pixel driving circuit of the second sub-pixel SP2 of the second pixel unit PX2 are located, which is conducive to respective arrangements of the first connecting line GL13 and the second connecting line GL14.

A plurality of fifth via holes VH5 expose at least parts of the first source regions 203*a* of the first transistors T1 of a plurality of sub-pixels respectively. An orthographic projection of the data signal line DL on the base substrate, an orthographic projection of the fifth via hole VH5 on the base substrate and an orthographic projection of the first source region 203*a* on the base substrate overlap at least partially with each other. Accordingly, the data signal lines DL of the sub-pixels are electrically connected to the first electrodes (e.g., the source electrodes) of the respective first transistors T1 through the fifth via holes VH5 respectively. Then, the data signal may be provided to the first electrodes (e.g., the source electrodes) of the first transistors T1 of the sub-pixels.

Specifically, in the first pixel unit PX1, each of the orthographic projection of the second via hole VH2 on the base substrate and the orthographic projection of the fifth via hole VH5 on the base substrate is spaced apart from the orthographic projection of the first connecting line GL13 on the base substrate 100, and the orthographic projection of the first connecting line GL13 on the base substrate 100 is located, in the first direction X, between the orthographic projection of the second via hole VH2 on the base substrate 100 and the orthographic projection of the fifth via hole VH5 on the base substrate 100.

In the second pixel unit PX2, each of the orthographic projection of the second via hole VH2 on the base substrate and the orthographic projection of the fifth via hole VH5 on the base substrate is spaced apart from the orthographic projection of the second connecting line GL14 on the base substrate 100, and the orthographic projection of the second connecting line GL14 on the base substrate 100 is located, in the first direction X, between the orthographic projection of the second via hole VH2 on the base substrate 100 and the orthographic projection of the fifth via hole VH5 on the base substrate 100.

In the first sub-pixel SP1 of the first pixel unit PX1, the orthographic projection of the second via hole VH2 on the base substrate 100 and the orthographic projection of the fifth via hole VH5 on the base substrate 100 are spaced apart by a first separation distance WD1 in the first direction X. In each of the second sub-pixel SP2, the third sub-pixel SP3 and the fourth sub-pixel SP4 of the first pixel unit PX1, an orthographic projection of the third via hole VH3 on the base substrate 100 and the orthographic projection of the fifth via hole VH5 on the base substrate 100 are spaced apart by a second separation distance WD2 in the first direction X. The first separation distance WD1 is greater than the second separation distance WD2.

In the second sub-pixel SP2 of the second pixel unit PX2, the orthographic projection of the second via hole VH2 on the base substrate 100 and the orthographic projection of the fifth via hole VH5 on the base substrate 100 are spaced apart by a third separation distance WD3 in the first direction X. In each of the first sub-pixel SP1, the third sub-pixel SP3 and the fourth sub-pixel SP4 of the second pixel unit PX2, the orthographic projection of the third via hole VH3 on the base substrate 100 and the orthographic projection of the fifth via hole VH5 on the base substrate 100 are spaced apart by a fourth separation distance WD 4 in the first direction X. The third separation distance WD3 is greater than the fourth separation distance WD4.

In the embodiments of the present disclosure, in the first sub-pixel SP1 of the first pixel unit PX1 and the second sub-pixel SP2 of the second pixel unit PX2, the separation distance between the second via hole VH2 and the fifth via hole VH5 in the first direction X is large, so that large spaces are provided to arrange the first connecting line GL13 and the second connecting line GL14 respectively.

The sixth via hole VH6 exposes at least part of the third gate electrode G3 of the third transistor T3 and at least part of the first drain region 205*a* of the first transistor T1. An orthographic projection of a part of the fourth conductive connecting portion 404 on the base substrate 100, an orthographic projection of a part of the sixth via hole VH6 on the base substrate 100 and an orthographic projection of a part of the third gate electrode G3 on the base substrate 100 overlap at least partially with each other. An orthographic projection of the other part of the fourth conductive connecting portion 404 on the base substrate 100, an orthographic projection of the other part of the sixth via hole VH6 on the base substrate 100 and an orthographic projection of a part of the first drain region 205*a* of the first transistor T1 on the base substrate 100 overlap at least partially with each other. Accordingly, the third gate electrode G3 of the third transistor T3 may be electrically connected to the second electrode (e.g., the drain electrode) of the first transistor T1 through the sixth via hole VH6.

The second conductive connecting portion 402 extends from the sensing signal line SL to opposite sides in the first direction X, that is, the second conductive connecting portion 402 and the sensing signal line SL form a continuously extending integral structure. The second conductive portion 102 extends in the first direction X. The third conductive connecting portion 403 and the second conductive connecting portion 402 are spaced apart in the first direction X. The third conductive connecting portion 402 is electrically connected to the second conductive portion 102 through the seventh via hole VH7, and the second conductive portion 102 is electrically connected to the second conductive connecting portion 402 through the eighth via hole VH8. The seventh via hole VH7 further exposes at least part of the second source region 203*b* of the second transistor T2. In this way, the sensing signal line SL may be electrically connected to the first electrode (e.g., the source electrode) of the second transistor T2 of each sub-pixel of a pixel unit. Then, the sensing signal may be provided to the first electrode (e.g., the source electrode) of the second transistor T2 of each sub-pixel of a pixel unit.

The ninth via hole VH9 exposes at least part of the second drain region 205*b* of the second transistor T2. The tenth via hole VH10 exposes at least part of the third drain region 205*c* of the third transistor T3. An orthographic projection of the third capacitor portion 405 on the base substrate 100 overlaps at least partially with each of an orthographic projection of the ninth via hole VH9 on the base substrate 100 and an orthographic projection of the tenth via hole VH10 on the base substrate 100. Accordingly, the third capacitor portion 405, the second electrode (e.g., the drain electrode) of the second transistor T2 and the second electrode (e.g., the drain electrode) of the third transistor T3 form a connection at the node SN.

A plurality of eleventh via holes VH11 expose parts of a same first auxiliary lines AL1 respectively. The first voltage line VDDL is electrically connected to a lower first auxiliary line AL1 through the plurality of eleventh via holes VH11. Through such parallel wiring mode, an IR drop (i.e., a voltage drop caused by resistance) on a signal line for transmitting the first voltage signal may be reduced.

A plurality of twelfth via holes VH12 expose parts of a same second auxiliary lines AL2 respectively. The sensing signal line SL is electrically connected to a lower second auxiliary line AL2 through the plurality of twelfth via holes VH12. Through such parallel wiring mode, an IR drop (i.e., a voltage drop caused by resistance) on a signal line for transmitting the sensing signal may be reduced.

A plurality of thirteenth via holes VH13 expose parts of a same third auxiliary line AL3 respectively. The auxiliary cathode line AVL is electrically connected to a lower third auxiliary line AL3 through the plurality of thirteenth via holes VH13. Through such parallel wiring mode, an IR drop (i.e., a voltage drop caused by resistance) on a signal line for transmitting the second voltage signal may be reduced.

Further, referring to FIG. 5 to FIG. 15B in combination, the first connecting line GL13 is spaced apart from the data signal line DL used to provide the data signal to the pixel driving circuit of the first sub-pixel SP1 of the first pixel unit PX1, and the first connecting line GL13 is spaced apart from the first voltage line VDDL used to provide the first voltage signal to the pixel driving circuit of the first sub-pixel SP1 of the first pixel unit PX1. The first connecting line GL13 is located, in the first direction X, between the data signal line DL used to provide the data signal to the pixel driving circuit of the first sub-pixel SP1 of the first pixel unit PX1 and the first voltage line VDDL used to provide the first voltage signal to the pixel driving circuit of the first sub-pixel SP1 of the first pixel unit PX1.

The second connecting line GL14 is spaced apart from the data signal line DL used to provide the data signal to the pixel driving circuit of the second sub-pixel SP2 of the second pixel unit PX2, and the second connecting line GL14 is spaced apart from the first voltage line VDDL used to provide the first voltage signal to the pixel driving circuit of the second sub-pixel SP2 of the second pixel unit PX2. The second connecting line GL14 is located, in the first direction X, between the data signal line DL used to provide the data signal to the pixel driving circuit of the second sub-pixel SP2 of the second pixel unit PX2 and the first voltage line VDDL used to provide the first voltage signal to the pixel driving circuit of the second sub-pixel SP2 of the second pixel unit PX2.

An orthographic projection of the first conductive portion 101 on the base substrate 100 and an orthographic projection of the first gate sub-line GL11 on the base substrate 100 are spaced apart in the second direction Y. The orthographic projection of the first conductive portion 101 on the base substrate 100 and an orthographic projection of the second gate sub-line GL12 on the base substrate 100 are spaced apart in the second direction Y.

Figure 17:
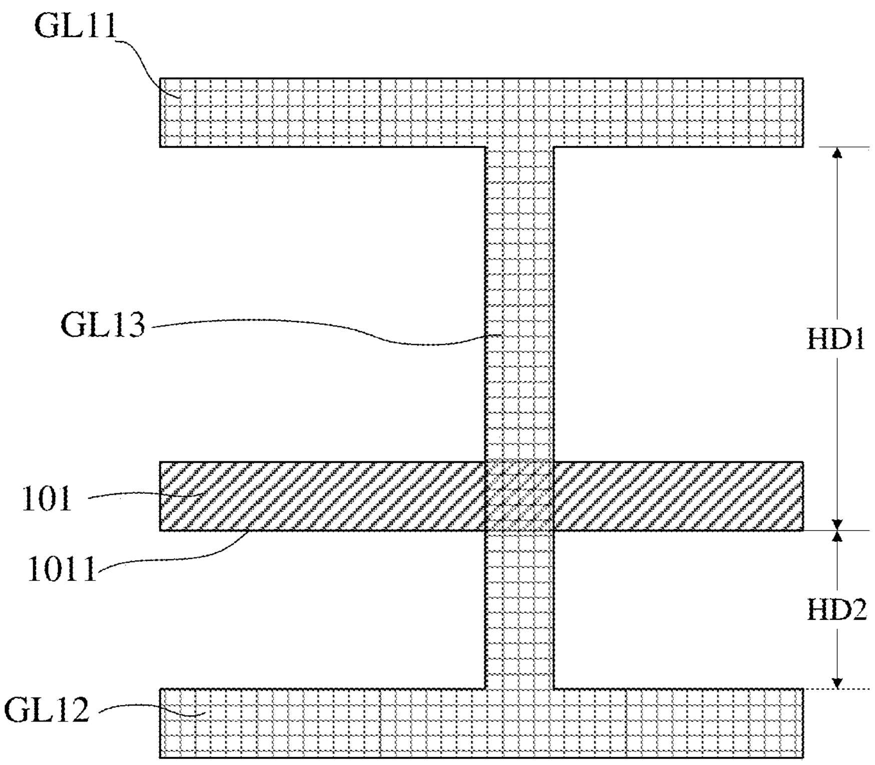
FIG. 17 shows a partial enlarged view of part I in FIG. 2.

FIG. 17 shows a partial enlarged view of part I in FIG. 2. Referring to FIG. 2 and FIG. 17 in combination, the first conductive portion 101 includes a first side surface 1011 away from the third via hole VH3. An orthographic projection of the first side surface 1011 of the first conductive portion on the base substrate 100 and the orthographic projection of the first gate sub-line GL11 on the base substrate 100 are spaced apart by a first distance HD1 in the second direction Y. The orthographic projection of the first side surface 1011 of the first conductive portion on the base substrate 100 and the orthographic projection of the second gate sub-line GL12 on the base substrate 100 are spaced apart by a second distance HD2 in the second direction Y. The second distance HD2 is less than the first distance HD1.

In the embodiments of the present disclosure, the first conductive portion 101 extends in the first direction X and is used to transmit the first voltage signal to the third transistors T3 of several sub-pixels other than those directly connected to the first voltage line VDDL, that is, the first conductive portion 101 is used to transmit the first voltage signal VDD. The first gate sub-line GL11 and the second gate sub-line GL12 also extend in the first direction X. Each of the first gate sub-line GL11 and the second gate sub-line GL12 does not overlap with the first conductive portion 101, so as to prevent the first voltage signal VDD transmitted on the first conductive portion 101 from affecting the first scanning signal transmitted on the first gate sub-line GL11 and the second gate sub-line GL12, which may help to maintain the stability of the performance of the first transistor T1. In addition, the second gate sub-line GL12 is located in the second conductive film layer 30, and components arranged near the second gate sub-line GL 12 in the second direction Y are mainly components in the third conductive film layer 40, that is, no components in the second conductive film layer 30 are arranged near the second gate sub-line GL12. Therefore, at a position near the second gate sub-line GL12, a small distance may be designed between conductive wires located in different conductive film layers, so that a space of the pixel driving circuit may be fully utilized.

In the embodiments of the present disclosure, an orthographic projection of the second gate line GL2 on the base substrate 100 overlaps partially with an orthographic projection of the first voltage line VDDL on the base substrate 100, an orthographic projection of the data signal line DL on the base substrate 100, an orthographic projection of the sensing signal line SL on the base substrate 100 and an orthographic projection of the auxiliary cathode line AVL on the base substrate 100 respectively at a first position PP1, a second position PP2, a third position PP3 and a fourth position PP4.

A second gate line GL2 includes at least one ring structure located in at least one of the first position PP1, the second position PP2, the third position PP3 and the fourth position PP4. For example, a second gate line GL2 includes a plurality of ring structures respectively located at the first position PP1 and the fourth position PP4.

For example, each of the orthographic projection of the third conductive connecting portion 403 on the base substrate 100, the orthographic projection of the second conductive portion 102 on the base substrate 100 and the orthographic projection of the second conductive connecting portion 402 on the base substrate 100 is spaced apart from an orthographic projection of the ring structure of the second gate line GL2 on the base substrate 100. That is, each of the orthographic projection of the third conductive connecting portion 403 on the base substrate 100, the orthographic projection of the second conductive portion 102 on the base substrate 100 and the orthographic projection of the second conductive connecting portion 402 on the base substrate 100 does not overlap with the orthographic projection of the ring structure of the second gate line GL2 on the base substrate 100.

In the embodiments of the present disclosure, there is no enough space to arrange the ring structure of the second gate line GL2 at the second position PP2 and the third position PP3 because at least one of the third conductive connecting portion 403, the second conductive portion 102 and the second conductive connecting portion 402 is arranged at the third position PP2 and the third position PP3. A plurality of ring structures of the second gate line GL2 are arranged at the first position PP1 and the fourth position PP4, so as to maximize the product yield while making full use of the space of the pixel driving circuit.

Referring to FIG. 1, FIG. 13 and FIG. 15B in combination, for at least one pixel unit group, the pixel driving circuits of the plurality of sub-pixels are arranged side by side in the first direction X, that is, arranged in a row; the anodes of the light emitting elements of the plurality of sub-pixels are arranged in two rows in the second direction Y. That is, in the embodiments of the present disclosure, the pixel driving circuits of the plurality of sub-pixels (e.g., eight sub-pixels) in a pixel unit group are arranged in a row, that is, in a 1*8 array; the anodes 701 of the plurality of sub-pixels (e.g., eight sub-pixels) in the pixel unit group are arranged in two rows, that is, in a 2*4 array.

Referring to FIG. 1 and FIG. 15B in combination, for a sub-pixel, a relationship between an orthographic projection of the pixel driving circuit of the sub-pixel on the base substrate and an orthographic projection of the anode 701 of the light emitting element of the sub-pixel on the base substrate may include: the orthographic projection of the pixel driving circuit of the sub-pixel on the base substrate exceeds the orthographic projection of the anode 701 of the light emitting element of the sub-pixel on the base substrate in the second direction Y; and/or the orthographic projection of the anode 701 of the light emitting element of the sub-pixel on the base substrate exceeds the orthographic projection of the pixel driving circuit of the sub-pixel on the base substrate in the first direction X.

It should be noted that the anode 701 of each sub-pixel may be electrically connected to a lower pixel driving circuit through an anode connecting hole VH20.

Optionally, the embodiments of the present disclosure further provide a display device, which may include the display substrate described above. The display device may include but not be limited to any product or component having a display function, such as electronic paper, mobile phone, tablet computer, television, display, notebook computer, digital photo frame, navigator, and so on. It should be understood that the display device has the same beneficial effects as the display substrate provided in the foregoing embodiments.

Although some embodiments according to the general concept of the present disclosure have been illustrated and described, it should be understood by those ordinary skilled in the art that modifications may be made to those embodiments without departing from the principle and spirit of the general inventive concept of the present disclosure. The scope of the present disclosure is defined by the claims and their equivalents.

What is claimed is:

1. A display substrate, comprising:

a base substrate;

a plurality of pixel units arranged on the base substrate, wherein the plurality of pixel units are arranged in an array in a first direction and a second direction, each of the pixel units comprises a plurality of sub-pixels, each of the sub-pixels comprises a light emitting element and a pixel driving circuit configured to drive the light emitting element, and the pixel driving circuit comprises a first transistor, a second transistor and a third transistor; and a plurality of gate lines arranged on the base substrate, wherein the plurality of gate lines comprise a plurality of first gate lines configured to provide a scanning signal to gate electrodes of the first transistors of the pixel driving circuits in a plurality of rows of sub-pixels respectively, and a plurality of second gate lines configured to provide a scanning signal to gate electrodes of the second transistors of the pixel driving circuits in a plurality of rows of sub-pixels respectively;

wherein at least one of the first gate lines comprises a first gate sub-line, a second gate sub-line and a plurality of connecting lines, the first gate sub-line and the second gate sub-line extend in the first direction, the plurality of connecting lines extend in the second direction, the first gate sub-line and the second gate sub-line are spaced apart in the second direction, the plurality of connecting lines are spaced apart in the first direction, and at least one of the plurality of connecting lines is configured to connect the first gate sub-line and the second gate sub-line;

wherein the display substrate comprises: a first conductive film layer arranged on the base substrate; a semiconductor film layer arranged on a side of the first conductive film layer away from the base substrate; a second conductive film layer arranged on a side of the semiconductor film layer away from the base substrate; and a third conductive film layer arranged on a side of the second conductive film layer away from the base substrate;

wherein at least one of the pixel driving circuits comprises a first active layer, a second active layer and a third active layer, and the first active layer, the second active layer and the third active layer are located in the semiconductor film layer; and a part of the first gate line overlapping with the first active layer forms the gate electrode of the first transistor, and a part of the second gate line overlapping with the second active layer forms a gate electrode of the second transistor;

wherein the display substrate further comprises: a first conductive portion, a second conductive portion and a first capacitor portion, wherein the first conductive portion, the second conductive portion and the first capacitor portion are located in the first conductive film layer; and a second capacitor portion located in the semiconductor film layer;

wherein the second capacitor portion is connected to the first active layer, and each of an orthographic projection of the first active layer on the base substrate, an orthographic projection of the second active layer on the base substrate, an orthographic projection of the third active layer on the base substrate and an orthographic projection of the second capacitor portion on the base substrate overlaps at least partially with an orthographic projection of the first capacitor portion on the base substrate; and wherein the display substrate further comprises a first voltage line, a data signal line, a sensing signal line and an auxiliary cathode line, and the first voltage line, the data signal line, the sensing signal line and the auxiliary cathode line are located in the third conductive film layer; and the first voltage line, the data signal line, the sensing signal line and the auxiliary cathode line extend in the second direction respectively, and any two of the first voltage line, the data signal line, the sensing signal line and the auxiliary cathode line are spaced apart in the first direction.

2. The display substrate according to claim 1, wherein a row of pixel units comprise a plurality of pixel unit groups, and each of the pixel unit groups comprises a first pixel unit and a second pixel unit adjacent to each other in the first direction; and the plurality of connecting lines comprise a first connecting line and a second connecting line, the first connecting line is located in a region where the first pixel unit in a pixel unit group is located, and the second connecting line is located in a region where the second pixel unit in a same pixel unit group is located.

3. The display substrate according to claim 2, wherein each of the first pixel unit and the second pixel unit comprises a first sub-pixel and a second sub-pixel; and the first connecting line is located in a region where the pixel driving circuit of the first sub-pixel of the first pixel unit is located, and the second connecting line is located in a region where the pixel driving circuit of the second sub-pixel of the second pixel unit is located.

4. The display substrate according to claim 3, wherein the display substrate further comprises at least one data signal line arranged in each of the first and second pixel units on the base substrate and at least one first voltage line arranged in each of the first and second pixel units on the base substrate, each of the at least one data signal line is configured to provide a data signal to at least one of the pixel driving circuits, each of the at least one first voltage line is configured to provide a first voltage signal to at least one of the pixel driving circuits, and the at least one data signal line and the at least one first voltage line extend in the second direction;

the first connecting line is spaced apart from the data signal line configured to provide the data signal to the pixel driving circuit of the first sub-pixel of the first pixel unit, and the first connecting line is spaced apart from the first voltage line configured to provide the first voltage signal to the pixel driving circuit of the first sub-pixel of the first pixel unit; and the first connecting line is located, in the first direction, between the data signal line configured to provide the data signal to the pixel driving circuit of the first sub-pixel of the first pixel unit and the first voltage line configured to provide the first voltage signal to the pixel driving circuit of the first sub-pixel of the first pixel unit.

5. The display substrate according to claim 4, wherein the second connecting line is spaced apart from the data signal line configured to provide the data signal to the pixel driving circuit of the second sub-pixel of the second pixel unit, and the second connecting line is spaced apart from the first voltage line configured to provide the first voltage signal to the pixel driving circuit of the second sub-pixel of the second pixel unit; and the second connecting line is located, in the first direction, between the data signal line configured to provide the data signal to the pixel driving circuit of the second sub-pixel of the second pixel unit and the first voltage line configured to provide the first voltage signal to the pixel driving circuit of the second sub-pixel of the second pixel unit.

6. The display substrate according to claim 5, wherein the first gate sub-line, the second gate sub-line and the plurality of connecting lines are located in the second conductive film layer.

7. The display substrate according to claim 6, wherein the first transistor comprises a first active layer located in the semiconductor film layer;

an orthographic projection of the first gate sub-line on the base substrate overlaps partially with an orthographic projection of the first active layer on the base substrate; and an orthographic projection of the second gate sub-line on the base substrate is spaced apart from the orthographic projection of the first active layer on the base substrate.

8. The display substrate according to claim 6, wherein orthographic projections of the plurality of connecting lines on the base substrate are spaced apart from an orthographic projection of the semiconductor film layer on the base substrate.

9. The display substrate according to claim 1, wherein at least one of the second gate lines comprises a gate line body portion and a gate line additional portion connected to the gate line body portion, and the at least one of the second gate lines comprises a ring structure surrounded by the gate line body portion and the gate line additional portion.

10. The display substrate according to claim 9, wherein the gate line additional portion comprises a first additional portion, a second additional portion and a third additional portion, the first additional portion and the second additional portion extend from the gate line body portion respectively in the second direction, the third additional portion extends in the first direction, one end of the first additional portion is connected to the gate line body portion, another end of the first additional portion is connected to one end of the third additional portion, another end of the third additional portion is connected to one end of the second additional portion, and another end of the second additional portion is connected to the gate line body portion.

11. The display substrate according to claim 10, wherein an orthographic projection of the second gate line on the base substrate overlaps partially with an orthographic projection of the first voltage line on the base substrate, an orthographic projection of the data signal line on the base substrate, an orthographic projection of a sensing signal line on the base substrate and an orthographic projection of an auxiliary cathode line on the base substrate respectively at a first position, a second position, a third position and a fourth position; and the second gate line comprises at least one ring structure located in at least one of the first position, the second position, the third position and the fourth position.

12. The display substrate according to claim 11, wherein the second gate line comprises a plurality of ring structures located at the first position and the fourth position respectively.

13. The display substrate according to claim 12, wherein, the display substrate further comprises a second conductive connecting portion and a third conductive connecting portion that are located in the third conductive film layer, and the second conductive connecting portion is connected to the sensing signal line;

in a pixel unit, each of the second active region of the second transistor of the first sub-pixel and the second active region of the second transistor of the second sub-pixel is electrically connected to the sensing signal line through the third conductive connecting portion, a second conductive portion and the second conductive connecting portion, and each of the second active region of the second transistor of the third sub-pixel and the second active region of the second transistor of the fourth sub-pixel is electrically connected to the sensing signal line through the second conductive connecting portion; and each of an orthographic projection of the third conductive connecting portion on the base substrate, an orthographic projection of the second conductive portion on the base substrate and an orthographic projection of the second conductive connecting portion on the base substrate is spaced apart from an orthographic projection of the ring structure of the second gate line on the base substrate.

14. The display substrate according to claim 1, wherein each of the first pixel unit and the second pixel unit further comprises a third sub-pixel and a fourth sub-pixel; and in each pixel unit in at least one pixel unit group, the pixel driving circuit of the first sub-pixel, the pixel driving circuit of the fourth sub-pixel, the pixel driving circuit of the third sub-pixel and the pixel driving circuit of the second sub-pixel are arranged in sequence in the first direction, wherein, in at least one pixel unit group, the third active layer of the pixel driving circuit of the first sub-pixel of the first pixel unit is electrically connected to the first voltage line through a first via hole; and an orthographic projection of the first via hole on the base substrate and an orthographic projection of the first connecting line on the base substrate are spaced apart from each other in the second direction and overlap at least partially with each other in the first direction, wherein, in at least one pixel unit group, each of the second sub-pixel, the third sub-pixel and the fourth sub-pixel of the first pixel unit comprises a first conductive connecting portion located in the third conductive film layer;

the first voltage line is electrically connected to the first conductive portion through a second via hole;

each of one end of the first conductive connecting portion of the second sub-pixel of the first pixel unit, one end of the first conductive connecting portion of the third sub-pixel of the first pixel unit and one end of the first conductive connecting portion of the fourth sub-pixel of the first pixel unit is electrically connected to the first conductive portion through a third via hole; and each of another end of the first conductive connecting portion of the second sub-pixel of the first pixel unit, another end of the first conductive connecting portion of the third sub-pixel of the first pixel unit and another end of the first conductive connecting portion of the fourth sub-pixel of the first pixel unit is electrically connected to the third active layer through a fourth via hole.

15. The display substrate according to claim 14, wherein, in at least one pixel unit group, the third active layer of the pixel driving circuit of the second sub-pixel of the second pixel unit is electrically connected to the first voltage line through a first via hole; and an orthographic projection of the first via hole for the second sub-pixel of the second pixel unit on the base substrate and an orthographic projection of the second connecting line on the base substrate are spaced apart from each other in the second direction and overlap at least partially with each other in the first direction, wherein, in at least one pixel unit group, each of the first sub-pixel, the third sub-pixel and the fourth sub-pixel of the second pixel unit comprises a first conductive connecting portion located in the third conductive film layer;

the first voltage line is electrically connected to the first conductive portion through a second via hole;

each of one end of the first conductive connecting portion of the first sub-pixel of the second pixel unit, one end of the first conductive connecting portion of the third sub-pixel of the second pixel unit and one end of the first conductive connecting portion of the fourth sub-pixel of the second pixel unit is electrically connected to the first conductive portion through a third via hole; and each of another end of the first conductive connecting portion of the first sub-pixel of the second pixel unit, another end of the first conductive connecting portion of the third sub-pixel of the second pixel unit and another end of the first conductive connecting portion of the fourth sub-pixel of the second pixel unit is electrically connected to the third active layer through a fourth via hole.

16. The display substrate according to claim 15, wherein the first active layer of the pixel driving circuit of each sub-pixel is electrically connected to the data signal line through a fifth via hole;

in the first pixel unit, each of an orthographic projection of the second via hole on the base substrate and an orthographic projection of the fifth via hole on the base substrate is spaced apart from the orthographic projection of the first connecting line on the base substrate, and the orthographic projection of the first connecting line on the base substrate is located, in the first direction, between the orthographic projection of the second via hole on the base substrate and the orthographic projection of the fifth via hole on the base substrate; and/or in the second pixel unit, each of the orthographic projection of the second via hole on the base substrate and the orthographic projection of the fifth via hole on the base substrate is spaced apart from the orthographic projection of the second connecting line on the base substrate, and the orthographic projection of the second connecting line on the base substrate is located, in the first direction, between the orthographic projection of the second via hole on the base substrate and the orthographic projection of the fifth via hole on the base substrate.

17. The display substrate according to claim 16, wherein, in the first sub-pixel of the first pixel unit, the orthographic projection of the second via hole on the base substrate and the orthographic projection of the fifth via hole on the base substrate are spaced apart by a first separation distance in the first direction; in each of the second sub-pixel, the third sub-pixel and the fourth sub-pixel of the first pixel unit, an orthographic projection of the third via hole on the base substrate and the orthographic projection of the fifth via hole on the base substrate are spaced apart by a second separation distance in the first direction; the first separation distance is greater than the second separation distance; and/or in the second sub-pixel of the second pixel unit, the orthographic projection of the second via hole on the base substrate and the orthographic projection of the fifth via hole on the base substrate are spaced apart by a third separation distance in the first direction; in each of the first sub-pixel, the third sub-pixel and the fourth sub-pixel of the second pixel unit, the orthographic projection of the third via hole on the base substrate and the orthographic projection of the fifth via hole on the base substrate are spaced apart by a fourth separation distance in the first direction; the third separation distance is greater than the fourth separation distance.

18. The display substrate according to claim 1, wherein an orthographic projection of the first conductive portion on the base substrate and an orthographic projection of the first gate sub-line on the base substrate are spaced apart in the second direction; and the orthographic projection of the first conductive portion on the base substrate and an orthographic projection of the second gate sub-line on the base substrate are spaced apart in the second direction, wherein the first conductive portion comprises a first side surface away from the third via hole, an orthographic projection of the first side surface of the first conductive portion on the base substrate and the orthographic projection of the first gate sub-line on the base substrate are spaced apart by a first distance in the second direction, the orthographic projection of the first side surface of the first conductive portion on the base substrate and the orthographic projection of the second gate sub-line on the base substrate are spaced apart by a second distance in the second direction, and the second distance is less than the first distance.

19. The display substrate according to claim 1, wherein the display substrate further comprises a first electrode layer on a side of the third conductive film layer away from the base substrate, and the display substrate comprises a plurality of anodes located in the first electrode layer; and for at least one pixel unit group, the pixel driving circuits of the plurality of sub-pixels are arranged side by side in the first direction, and the anodes of the light emitting elements of the plurality of sub-pixels are arranged in two rows in the second direction, wherein for a sub-pixel, a relationship between an orthographic projection of the pixel driving circuit of the sub-pixel on the base substrate and an orthographic projection of the anode of the light emitting element of the sub-pixel on the base substrate comprises:

the orthographic projection of the pixel driving circuit of the sub-pixel on the base substrate exceeds the orthographic projection of the anode of the light emitting element of the sub-pixel on the base substrate in the second direction; and/or the orthographic projection of the anode of the light emitting element of the sub-pixel on the base substrate exceeds the orthographic projection of the pixel driving circuit of the sub-pixel on the base substrate in the first direction.

20. A display device, comprising the display substrate of claim 1.

* * * * *